United States Patent
Maryfield et al.

(10) Patent No.: US 9,816,782 B2
(45) Date of Patent: Nov. 14, 2017

(54) RIFLESCOPE WITH INTEGRATED WIND SENSOR AND TARGETING DISPLAY

(71) Applicant: Cubic Corporation, San Diego, CA (US)

(72) Inventors: Tony Maryfield, Poway, CA (US); Mahyar Dadkhah, San Diego, CA (US); Christian Cugnetti, San Diego, CA (US)

(73) Assignee: Cubic Corporation, San Diego, CA (US)

( * ) Notice: Subject to any disclaimer, the term of this patent is extended or adjusted under 35 U.S.C. 154(b) by 0 days.

(21) Appl. No.: 15/065,701

(22) Filed: Mar. 9, 2016

(65) Prior Publication Data

US 2016/0265880 A1     Sep. 15, 2016

Related U.S. Application Data

(60) Provisional application No. 62/130,349, filed on Mar. 9, 2015, provisional application No. 62/131,734, filed
(Continued)

(51) Int. Cl.
*F41G 1/00*      (2006.01)
*F41G 3/08*      (2006.01)
(Continued)

(52) U.S. Cl.
CPC ............... *F41G 3/08* (2013.01); *F41G 1/38* (2013.01); *F41G 3/06* (2013.01); *F41G 3/145* (2013.01);
(Continued)

(58) Field of Classification Search
CPC ..................................... F41G 1/38; F41G 3/08
See application file for complete search history.

(56) References Cited

U.S. PATENT DOCUMENTS

| | | | |
|---|---|---|---|
| 5,645,550 A | 7/1997 | Hohla | |
| 6,247,259 B1 * | 6/2001 | Tsadka | F41G 3/06 42/114 |

(Continued)

FOREIGN PATENT DOCUMENTS

| | | |
|---|---|---|
| DE | 19846655 A1 | 4/1999 |
| EP | 1126299 A1 | 8/2001 |

(Continued)

OTHER PUBLICATIONS

Invitation to Pay Additional Fees and Partial Search Report dated Jun. 8, 2016 for International Application No. PCT/US2016/021625, filed Mar. 9, 2016; all pages.

(Continued)

*Primary Examiner* — Gabriel Klein
(74) *Attorney, Agent, or Firm* — Kilpatrick, Townsend & Stockton, LLP

(57) ABSTRACT

Techniques are disclosed for providing the weapon-mounted optical scope that provides for wind sensing and the display a ballistic solution without the need for a separate device. Embodiments may include various additional sensors housed within the weapon-mounted optical scope to provide data for the ballistic solution calculation. Embodiments may further include a display at the input aperture rather than internally at the first-focal-plane, enabling for simpler, more cost effective embodiments. Additionally or alternatively, embodiments may include a laser, separate from the wind sensing laser, to perform range-finding functions, and/or an enhanced-image assembly.

10 Claims, 27 Drawing Sheets

Related U.S. Application Data on Mar. 11, 2015, provisional application No. 62/137,094, filed on Mar. 23, 2015, provisional application No. 62/137,097, filed on Mar. 23, 2015, provisional application No. 62/137,100, filed on Mar. 23, 2015, provisional application No. 62/137,111, filed on Mar. 23, 2015, provisional application No. 62/138,237, filed on Mar. 25, 2015, provisional application No. 62/138,240, filed on Mar. 25, 2015, provisional application No. 62/138,895, filed on Mar. 26, 2015, provisional application No. 62/140,147, filed on Mar. 30, 2015, provisional application No. 62/144,230, filed on Apr. 7, 2015, provisional application No. 62/144,837, filed on Apr. 8, 2015, provisional application No. 62/145,413, filed on Apr. 9, 2015.

(51) Int. Cl.

| | | |
|---|---|---|
| G06T 7/33 | (2017.01) | |
| F41G 3/06 | (2006.01) | |
| G02B 23/10 | (2006.01) | |
| G02B 23/18 | (2006.01) | |
| G02B 27/20 | (2006.01) | |
| H04N 5/33 | (2006.01) | |
| H04N 13/02 | (2006.01) | |
| F41G 1/38 | (2006.01) | |
| F41G 3/14 | (2006.01) | |
| G06T 5/00 | (2006.01) | |
| G06T 5/20 | (2006.01) | |
| G06T 5/50 | (2006.01) | |
| G06T 11/60 | (2006.01) | |
| H04N 5/232 | (2006.01) | |
| G06T 7/20 | (2017.01) | |
| G06T 7/73 | (2017.01) | |
| G01S 17/88 | (2006.01) | |

(52) U.S. Cl.
CPC ........... *G02B 23/105* (2013.01); *G02B 23/18* (2013.01); *G02B 27/20* (2013.01); *G06T 5/003* (2013.01); *G06T 5/20* (2013.01); *G06T 5/50* (2013.01); *G06T 7/20* (2013.01); *G06T 7/33* (2017.01); *G06T 7/73* (2017.01); *G06T 11/60* (2013.01); *H04N 5/23222* (2013.01); *H04N 5/33* (2013.01); *H04N 13/0203* (2013.01); *G01S 17/88* (2013.01); *G06T 2207/10012* (2013.01); *G06T 2207/10016* (2013.01); *G06T 2207/10048* (2013.01); *G06T 2207/20224* (2013.01); *G06T 2207/30212* (2013.01)

(56) References Cited

U.S. PATENT DOCUMENTS

| | | | |
|---|---|---|---|
| 9,127,911 B2 | 9/2015 | Varshneya et al. | |
| 9,157,701 B2 | 10/2015 | Varshneya et al. | |
| 9,335,124 B2 | 5/2016 | Maryfield et al. | |
| 9,466,120 B2 | 10/2016 | Maryfield et al. | |
| 2006/0010760 A1* | 1/2006 | Perkins | F41G 1/473 |
| | | | 42/142 |
| 2007/0030460 A1 | 2/2007 | Mehrl | |
| 2009/0223072 A1* | 9/2009 | Morin | F41G 1/14 |
| | | | 33/263 |
| 2009/0278799 A1 | 11/2009 | Wilson | |
| 2010/0128136 A1* | 5/2010 | Belenkii | F41G 1/38 |
| | | | 348/222.1 |
| 2011/0221919 A1 | 9/2011 | Zhang | |
| 2012/0042559 A1* | 2/2012 | Bockmon | F41A 27/30 |
| | | | 42/111 |
| 2012/0273571 A1* | 11/2012 | Kremer | F41G 3/06 |
| | | | 235/404 |
| 2013/0199074 A1* | 8/2013 | Paterson | F41G 3/06 |
| | | | 42/122 |
| 2015/0008260 A1* | 1/2015 | Volfson | G01S 17/107 |
| | | | 235/404 |
| 2015/0176948 A1* | 6/2015 | Varshneya | F41G 3/08 |
| | | | 235/404 |
| 2015/0176949 A1* | 6/2015 | Varshneya | F41G 3/06 |
| | | | 235/404 |
| 2015/0345908 A1 | 12/2015 | Maryfield et al. | |
| 2016/0202282 A1 | 7/2016 | Maryfield et al. | |
| 2016/0301183 A1 | 10/2016 | Maryfield et al. | |

FOREIGN PATENT DOCUMENTS

| | | | |
|---|---|---|---|
| GB | 2448314 A | 10/2008 | |
| WO | 2013/002856 A2 | 1/2013 | |
| WO | 2013/122673 A2 | 8/2013 | |
| WO | WO 2013122673 A2 * | 8/2013 | ............... F41G 3/06 |
| WO | 2016/145124 A | 9/2016 | |
| WO | 2016/145124 A2 | 9/2016 | |

OTHER PUBLICATIONS

International Search Report and Written Opinion dated Oct. 4, 2016 for International Application No. PCT/US2016/021625, filed Mar. 9, 2016; all pages.

Restriction Requirement dated Sep. 22, 2016 for U.S. Appl. No. 15/065,701, filed Mar. 9, 2016; all pages.

Notice of Allowance dated Nov. 17, 2016 for U.S. Appl. No. 15/270,827, filed Sep. 20, 2016; all pages.

* cited by examiner

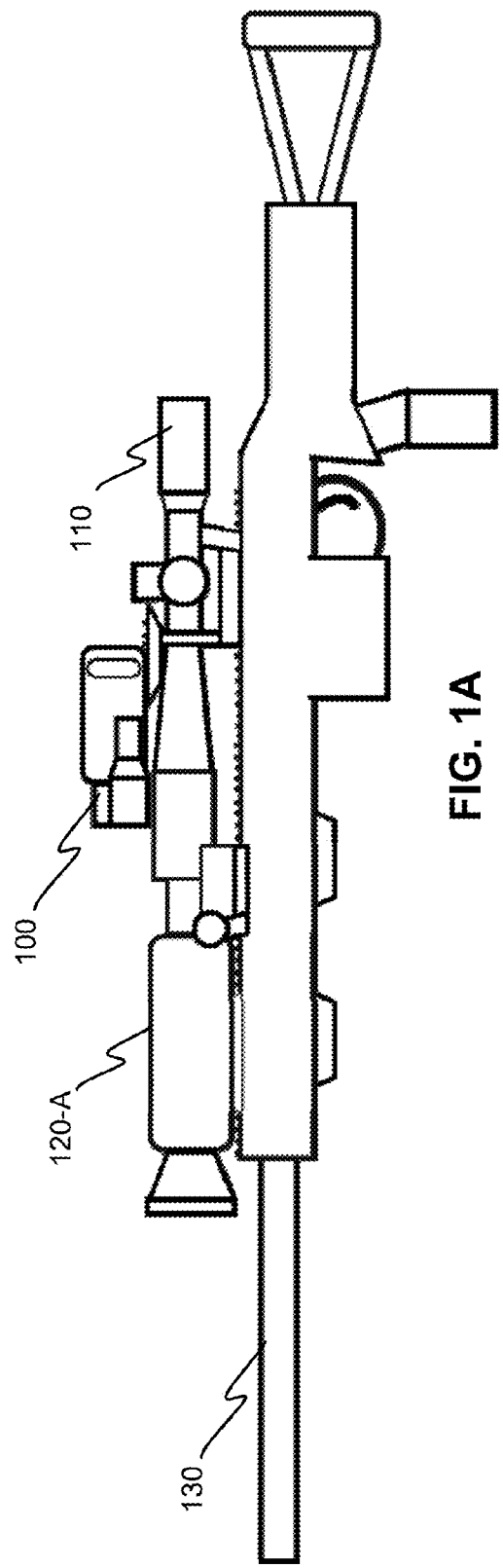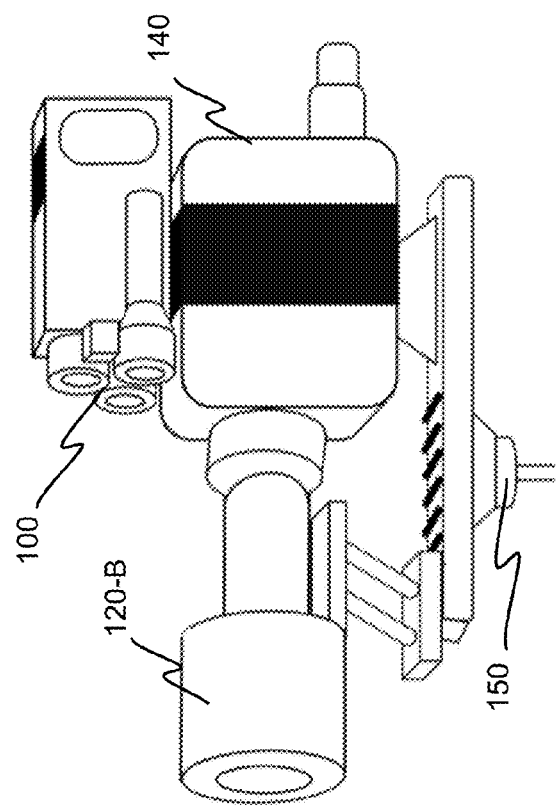
FIG. 1A
FIG. 1B

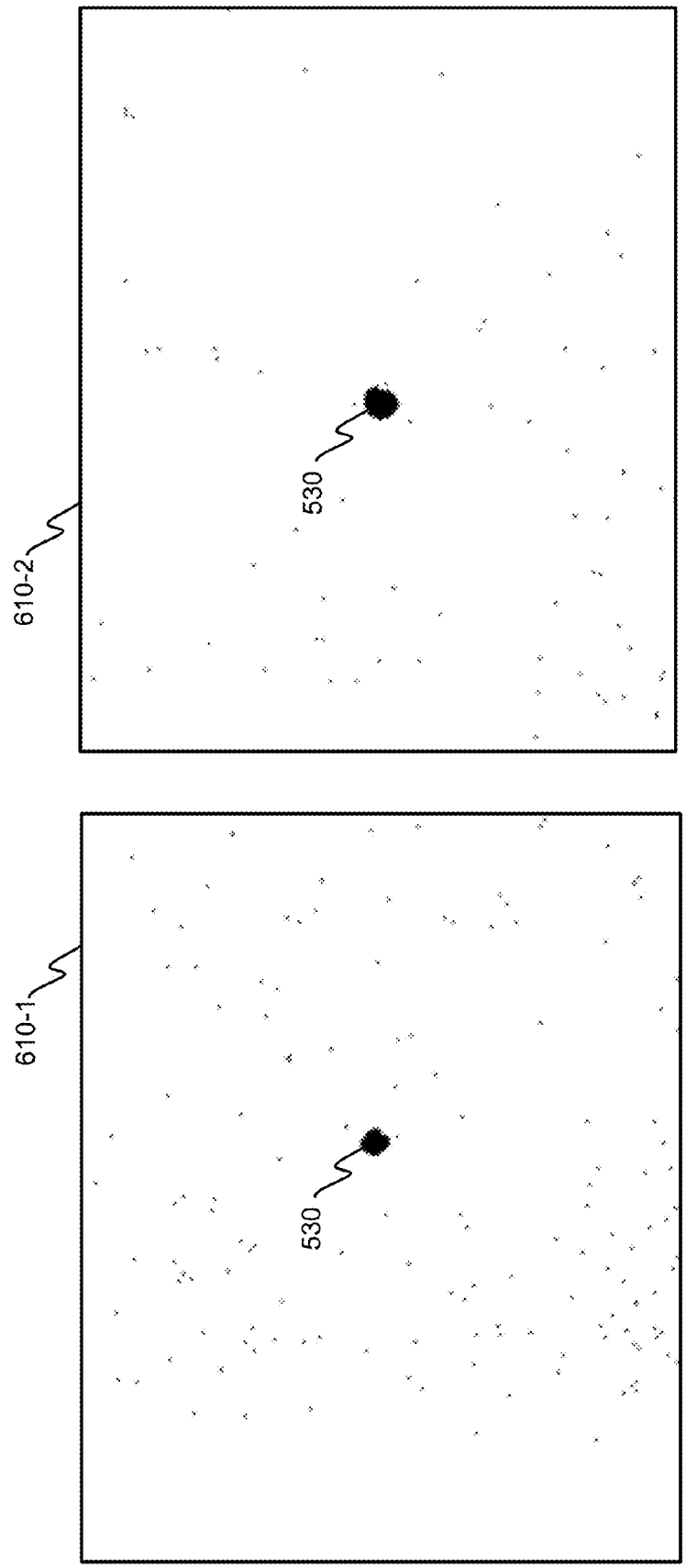

US 9,816,782 B2

RIFLESCOPE WITH INTEGRATED WIND SENSOR AND TARGETING DISPLAY

CROSS-REFERENCES TO RELATED APPLICATIONS

The present application claims benefit under 35 USC 119(e) of

U.S. Provisional Application No. 62/130,349, filed on Mar. 9, 2015, entitled "Stabilized Laser Mounting Technique for Picatinny Rails,"

U.S. Provisional Application No. 62/131,734, filed on Mar. 11, 2015, entitled "Sniper Multifunction Wind and Range Measurement with Ballistic Computer,"

U.S. Provisional Application No. 62/137,094, filed on Mar. 23, 2015, entitled "Integrated Wind Laser Rangefinder Receiver,"

U.S. Provisional Application No. 62/137,097, filed on Mar. 23, 2015, entitled "Infrared Laser Spot Finding,"

U.S. Provisional Application No. 62/137,100, filed on Mar. 23, 2015, entitled "Integrated Wind Laser Rangefinder Receiver ASIC (Application Specific Integrated Circuit),"

U.S. Provisional Application No. 62/137,111, filed on Mar. 23, 2015, entitled "Infrared Laser Bore-Sighting Using Infrared And CMOS Cameras,"

U.S. Provisional Application No. 62/138,237, filed on Mar. 25, 2015, entitled "Athermalized Optics For Side By Side SWIR Images Used In Wind Sensing,"

U.S. Provisional Application No. 62/138,240, filed on Mar. 25, 2015, entitled "Clip-On Wind Sensor With Targeting Display For Snipers,"

U.S. Provisional Application No. 62/138,895, filed on Mar. 26, 2015, entitled "Smart Phone Application For Wind Sensor With Ballistic Computer And Laser Rangefinder,"

U.S. Provisional Application No. 62/140,147, filed on Mar. 30, 2015, entitled "Peak Detection Optical Receiver System,"

U.S. Provisional Application No. 62/144,230, filed on Apr. 7, 2015, entitled "Integrated Photodiode With Wind Laser Rangefinder Receiver ASIC (Application Specific Integrated Circuit),"

U.S. Provisional Application No. 62/144,837, filed on Apr. 8, 2015, entitled "Integrated Riflescope With Integrated Wind Sensor And Targeting," and U.S. Provisional Application No. 62/145,413, filed on Apr. 9, 2015, entitled "Integrated Target Tracking With Wind Sensing Laser Rangefinder And Ballistic Computer,"

all of which are incorporated by reference herein in their entirety.

The following regular U.S. patent applications (including this one) are being filed concurrently, and the entire disclosure of the other applications are incorporated by reference into this application for all purposes:

Application Ser. No. 15/065,724, filed Mar. 9, 2016, entitled "Integrated Wind Laser Rangefinder Receiver";

Application Ser. No. 15/065,732, filed Mar. 9, 2016, entitled "Optical Sensor For Range Finding And Wind Sensing Measurements";

Application Ser. No. 15/065,715, filed Mar. 9, 2016, entitled "Laser Spot Finding"; and Application Ser. No. 15/065,701, filed Mar. 9, 2016, entitled "Riflescope With Integrated Wind Sensor And Targeting Display".

BACKGROUND

Optical devices such as optical scopes and rangefinders can be utilized in a variety of applications. In military applications, such devices can be mounted to weapons to enable tracking of a target and increase accuracy in aiming the weapon. Systems utilized by snipers can bring an added degree of sophistication because many conditions can impact long-range shots, including range, wind, elevation, and more. Weapon-mounted optical systems can integrate sensors and devices to provide information regarding these conditions. However, gathering information regarding wind traditionally has been difficult.

Recent technologies have enabled wind sensing to be performed using stereoscopic laser receivers. Examples of these technologies can be found in U.S. patent application Ser. No. 14/696,004, filed on Apr. 24, 2015, entitled "Athermalized Optics For Laser Wind Sensing," (hereafter "the '004 application") which is incorporated by reference herein in its entirety. Such technologies, however, can include components that are very expensive, may suffer from misalignment due to shock from the firing of a weapon, may implement bore-sighting techniques can be difficult and time consuming, and/or suffer from other issues.

BRIEF SUMMARY

Techniques are disclosed for providing the weapon-mounted optical scope that provides for wind sensing and the display a ballistic solution without the need for a separate device. Embodiments may include various additional sensors housed within the weapon-mounted optical scope to provide data for the ballistic solution calculation. Embodiments may further include a display at the input aperture rather than internally at the first-focal-plane, enabling for simpler, more cost effective embodiments. Additionally or alternatively, embodiments may include a laser, separate from the wind sensing laser, to perform range-finding functions, and/or an enhanced-image assembly.

According to the disclosure, an example weapon-mounted optical scope comprises an objective lens, and a display assembly configured to, when displaying an object, emit light such that the emitted light enters the objective lens. The weapon-mounted optical scope further comprises an eyepiece configured to enable a user to see an image from light entering the objective lens, one or more orientation sensors, a positioning unit, a first laser, and an optical receiver comprising two subassemblies, wherein each subassembly comprises a sensor and a set of one or more lenses configured to direct light toward the sensor. The weapon-mounted optical scope further comprises a processing unit communicatively coupled with the first laser, the optical receiver, the one or more orientation sensors, and the positioning unit. The processing unit is configured to cause the first laser to emit a laser beam, obtain measurements of reflected light of the laser beam from the optical receiver, calculate a wind measurement based on the obtained measurements of the reflected light, determine a ballistic solution based on the wind measurement and data from the one or more orientation sensors and the positioning unit, and cause the display assembly to display information indicative of the ballistic solution.

The example weapon-mounted optical scope can include one or more of the following features. The weapon-mounted optical scope can comprise a second laser, and the processing unit can be further configured to cause the second laser to emit one or more laser pulses, obtain one or more measurements of reflected light of the one or more laser pulses from the sensor of one subassembly of the optical receiver, calculate a range measurement based on the obtained one or more measurements of the reflected light, and determine the ballistic solution further based on the range measurement. The weapon-mounted optical scope can comprise an enhanced image assembly. The enhanced image assembly includes a beam splitter configured to direct a portion of the light entering the objective lens to a camera communicatively coupled with the processing unit, and the processing unit can be configured to process an image captured by the camera. The enhanced image assembly further includes an internal display configured to show the image processed by the processing unit, and a mirror configured to direct light from the internal display such that the internal display is viewable through the eyepiece. The enhanced image assembly can further comprise a dial to control orientation of the mirror such that the mirror operates in two modes: a first mode in which the mirror is configured to direct light from the internal display such that the internal display is viewable through the eyepiece, and a second mode in which the mirror is configured to enable the user to see the image from the light entering the objective lens. The beam splitter can be configured to direct infrared light to the camera. The processing unit can be configured to process the image captured by the camera by reducing blur in the image. The sensor of each subassembly can comprise a photodiode. The sensor of each subassembly comprises a portion of a camera. The camera can be a shortwave infrared (SWIR) camera. The weapon-mounted optical scope can further comprise a keypad configured to operate as a user input interface to one or more electrical components disposed within the weapon-mounted optical scope.

According to the disclosure, a method of displaying a ballistic solution with a weapon-mounted optical scope comprises causing a first laser of the weapon-mounted optical scope to emit a laser beam, obtaining measurements of reflected light of the laser beam from an optical receiver of the weapon-mounted optical scope, where the optical receiver comprises two subassemblies, each subassembly comprises a sensor and a set of one or more lenses configured to direct light toward the sensor. The method further comprises calculating a wind measurement based on the obtained measurements of the reflected light of the laser beam, determining the ballistic solution based on the wind measurement and data from one or more orientation sensors and a positioning unit, and causing a display assembly to display information indicative of the ballistic solution by emitting light such that the emitted light enters an objective lens of the weapon-mounted optical scope.

The example method of displaying a ballistic solution with a weapon-mounted optical scope can include one or more of the following features. The method may further comprise causing a second laser of the weapon-mounted optical scope to emit one or more laser pulses, obtaining one or more measurements of reflected light of the one or more laser pulses from the sensor of one subassembly of the optical receiver, calculating a range measurement based on the obtained one or more measurements of the reflected light of the one or more laser pulses, and determining the ballistic solution further based on the range measurement. The method may further comprise directing a portion of the light entering the objective lens to a camera, processing an image captured by the camera, and showing the processed image with an internal display of the weapon-mounted optical scope. The method may further comprise directing light from the internal display with a mirror such that the internal display is viewable through an eyepiece of the weapon-mounted optical scope. The portion of the light may comprise infrared light. Processing the image captured by the camera may comprise reducing blur in the image.

According to the disclosure, another example weapon-mounted optical scope comprises an objective lens, an eyepiece configured to enable a user to see an image from light entering the objective lens, one or more orientation sensors, a positioning unit, an optical receiver, a camera, a beam splitter configured to direct a portion of the light entering the objective lens to the camera, an internal display, and a processing unit communicatively coupled with the camera, the internal display, the optical receiver, the one or more orientation sensors, and the positioning unit. The processing unit is configured to calculate a wind measurement based on measurements of reflected laser light obtained via the optical receiver, determine a ballistic solution based on the wind measurement and data from the one or more orientation sensors and the positioning unit, process an image captured by the camera, and cause the internal display to show the processed image with an indication of the ballistic solution.

The example weapon-mounted optical scope can include one or more of the following features. The processing unit can be further configured to obtain one or more measurements of reflected light of one or more laser pulses from the sensor of one subassembly of the optical receiver, calculate a range measurement based on the obtained one or more measurements of the reflected light of one or more laser pulses, and determine the ballistic solution further based on the range measurement. The weapon-mounted optical scope can further include a mirror configured to direct light from the internal display such that the internal display is viewable through the eyepiece. The weapon-mounted optical scope can further include a dial to control orientation of the mirror such that the mirror operates in two modes: a first mode in which the mirror is configured to direct light from the internal display such that the internal display is viewable through the eyepiece, and a second mode in which the mirror is configured to enable the user to see the image from the light entering the objective lens.

BRIEF DESCRIPTION OF THE DRAWINGS

For a more complete understanding of this invention, reference is now made to the following detailed description of the embodiments as illustrated in the accompanying drawings, in which like reference designations represent like features throughout the several views and wherein:

FIGS. 1A and 1B are illustrations of different example configurations in which laser-based optical devices described herein may be utilized;

FIGS. 5A-11 are images (inverted to facilitate reproducibility) captured by a SWIR camera;

Figure 2:
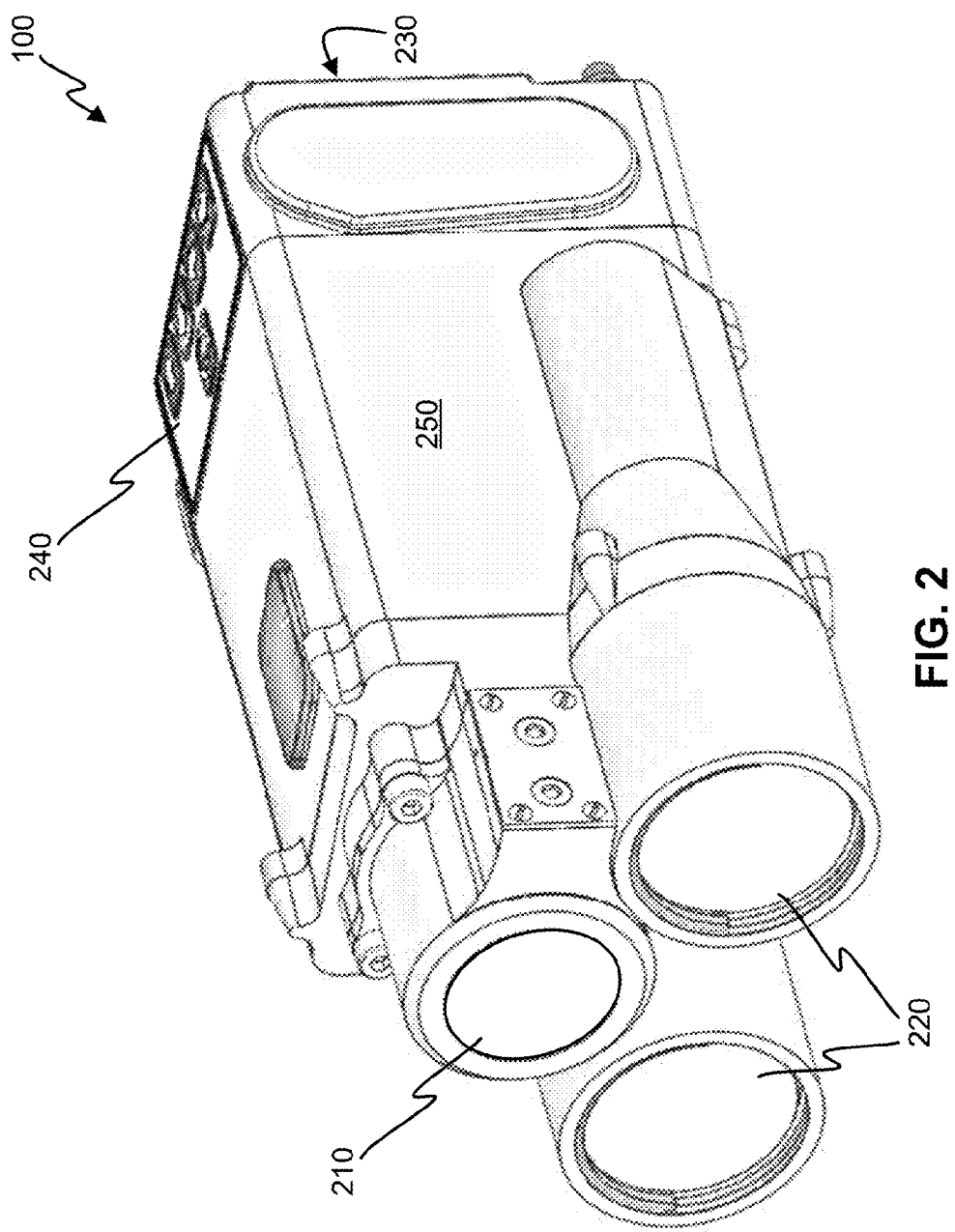
FIG. 2 is an auxiliary view of a laser-based optical device, according to an embodiment.

In the appended figures, similar components and/or features may have the same reference label. Further, various components of the same type may be distinguished by following the reference label by a dash and a second label that distinguishes among the similar components. If only the first reference label is used in the specification, the description is applicable to any or all of the similar components having the same first reference label irrespective of the second reference label.

DETAILED DESCRIPTION OF THE INVENTION

The ensuing description provides embodiments only, and is not intended to limit the scope, applicability or configuration of the disclosure. Rather, the ensuing description of the embodiments will provide those skilled in the art with an enabling description for implementing an embodiment. It is understood that various changes may be made in the function and arrangement of elements without departing from the scope.

As provided herein, and broadly speaking, "bore sighting" a laser-based optical device to an apparatus means adjusting the laser-based optical device such that a laser of the laser-based optical device illuminates a target at which the apparatus is aimed. This ensures that range, wind, and/or other measurements taken by the laser-based devices accurately reflect measurements taken with respect to the target. A weapon-mounted laser-based rangefinder, for example, would not provide accurate range measurements of a target at which the weapon is pointed if the aim of the rangefinder's laser (used to take the range measurement of the target) is not properly aligned—or bore sighted—with the weapon.

Additionally, as used herein, the term "frame" refers to an image captured by a camera. A video camera, therefore, may capture many successive frames in rapid fashion. Thus, the terms "frame" and "image" are used interchangeably herein.

Laser rangefinders and other laser-based optical devices can be mounted to and used in conjunction with another apparatus, such as a weapon and/or optical scope. In military applications, such devices can be mounted to weapons or spotting scopes to enable tracking of a target and increase accuracy in aiming the weapon. Optical devices utilized by snipers can bring an added degree of sophistication because they may be able to detect conditions that can impact long-range shots, including range, wind, elevation, and more.

Various techniques are disclosed herein for improving the functionality of traditional wind sensing devices and/or providing for new and improved wind sensing devices. It will be understood that although embodiments describe particular type of laser-based optical devices (e.g., capable of taking wind and range measurements), many techniques described herein may apply to other types of laser-based optical devices as well, including rangefinders, optical communication systems, and the like.

FIGS. 1A and 1B provide illustrations of different example setups in which such laser-based optical devices may be utilized in sniper applications. It will be understood, however, that laser-based optical devices may be utilized in other types of setups and in other types of applications not illustrated.

FIG. 1A illustrates a setup in which a laser-based optical device 100 is mounted to a weapon 130, such as a sniper rifle or other long range firearm. Here, the weapon 130 has an optical scope 110 utilized by a user to aim the weapon at a target, and the laser-based optical device 100 is mounted to the optical scope 110. Because the optical scope 110 is used to aim the weapon 130, the laser-based optical device 100 may then be bore sighted with the optical scope 110. In other applications and/or setups, the laser-based optical device 100 may be mounted directly to the weapon 130, which may or may not have an optical scope. One or more additional devices, such as infrared (IR) adapter 120-A may be used in conjunction with the laser-based optical device 100 and optical scope 110. For weapon-based applications such as the one shown in FIG. 1A, features such as mounting hardware and internal components of the laser-based optical device 100 and/or other devices may be adapted to maintain their integrity and/or orientation when exposed to the shock of the weapon being fired.

FIG. 1B illustrates an alternative setup in which the laser-based optical device 100 is mounted to a spotting scope 140, which is mounted to a tripod 150 (only the top of which is illustrated). Again, the laser-based optical device 100 and/or the spotting scope 140 may be utilized with one or more other devices, such as IR adapter 120-B.

FIG. 2 is an auxiliary view of a laser-based optical device 100, according to an embodiment. Here, the laser-based optical device 100 is capable of taking laser-based range and wind measurements, along with providing other (non-laser-based) measurements. Other laser-based optical devices may provide additional and/or alternative functions than those provided by the embodiment shown in FIG. 2. Size, weight, and/or other traits can vary, depending on desired features.

As shown in FIG. 2, this particular laser-based optical device 100 can include optics 210 through which a laser light is transmitted and stereoscopic (e.g., right and left) receiving optics 220 through which reflected laser light is received. The optical device laser-based optical device may further include a display, e.g., on a back surface 230 of the laser-based optical device 100, to show one or more images received through one or both of the stereoscopic receiving optics 220, which can direct light toward one or more internal cameras and/or other photodetectors, and a control panel 240 with input devices (e.g., one or more buttons, switches, touchpads, touchscreens, and the like) for proving a user interface through which user input may be received. The user may provide input to initiate one or more of various techniques described herein.

The body 250 of the laser-based optical device 100 and/or components housed therein can include any of a variety of materials, depending on desired functionality, manufacturing concerns, and/or other factors. In some embodiments, the body comprises aluminum, based on the relative high thermal conductivity, strength, cost, relative ease of casting/machinability, and/or other concerns. The body 250 may comprise a mountable body configured to be mounted or otherwise coupled to an apparatus, as shown in FIGS. 1A and 1B, and housing (at least partly) a laser, a laser-steering assembly, and a camera, as described in more detail below. In some embodiments, the body 250 may also house a processing unit, also described in more detail below.

General use of the laser-based optical device 100 may vary, depending on desired functionality. According to some embodiments, the user may bore sight the laser-based optical device 100 with an apparatus (e.g., weapon, optical scope, spotting scope, etc.) to which the laser-based optical device 100 is mounted by providing an input (e.g., pressing a button on the control panel 240) and/or using manual mounting screws, as discussed in more detail below. Once the optical device is bore sighted, the user may aim the apparatus toward a target and provide one or more inputs to cause the laser-based optical device 100 to take measurements, such as determining the range of the target and/or taking laser-based measurements of the crosswind between the laser-based optical device 100 and the target. Once the measurements are taken, the laser-based optical device 100 can utilize these measures (optionally with additional data, such as position, tilt, temperature, humidity, etc.), to determine a ballistic solution for firing a weapon at the target. The laser-based optical device 100 can then display the ballistic solution (e.g., an offset aim point) on its display and/or on a display (e.g., a display visible through the optical scope 110).

Additional information regarding the laser-based optical device 100 illustrated in FIG. 2 is provided in the '004 application incorporated herein above, and U.S. patent application Ser. No. 14/728,133 entitled "Infrared Laser Automatic Bore-Sighting," which is incorporated by reference herein in its entirety.

Wind sensing generally involves transmitting laser light onto a target via the optics 210, receiving the reflected laser light via the stereoscopic receiving optics 220, and comparing the right and left inputs of the stereoscopic receiving optics 220 to determine scintillations and/or other fluctuations in the reflected laser light to determine the presence and magnitude of any crosswinds between the target and the laser-based optical device 100. Additional information regarding such wind sensing is described U.S. Pat. No. 9,127,911 entitled "Electro-Optic System For Crosswind Measurement," which is incorporated by reference herein in its entirety. Typically, right and left inputs comprise camera images of a scene including the target in the reflected laser light. Thus, determining where the reflected laser light is within the left and right images can be vital to the functionality of the laser-based optical device 100. Furthermore, these images can be taken at several hundred per second (e.g., 700 fps, 1000 fps, etc.), thus steps can be taken to help facilitate image capture and laser spot finding at a relatively high speed rate.

According to some embodiments, a laser-based optical device 100 may additionally include a CMOS camera, and utilize both short-wave infrared (SWIR) and CMOS cameras to facilitate bore sighting as described below.

Infrared Laser Bore-Sighting Using Infrared and CMOS Cameras

The laser-based optical device 100 and other laser-based devices such as rangefinders, riflescopes, infrared lasers, etc. are required to be accurately bore sighted for tactical sniper shooting applications. That is, lasers emitted by these devices should accurately correspond to where a weapon (or other device, such as a spotting scope) is aimed. Problematically, however, many laser-based devices used for military applications emit infrared laser beams that invisible to the naked eye. This can make it difficult to bore sight such laser-based devices to riflescopes or other devices.

Using a SWIR camera to determine where the infrared laser is targeted may not provide sufficient image contrast ratio, particularly when a narrow band sunlight filter is employed to reduce background noise. It has been determined, for example, that the location of the laser spot generated by an infrared laser in an image captured by a SWIR camera and shown on the display of the laser-based optical device 100 may not be easily determined with respect to physical features in the image because the contrast of the image is so low that the physical features may not be clearly visible.

To overcome this issue, techniques disclosed herein can utilize both a visible-light (CMOS) camera and a SWIR camera to provide a high contrast image of the target with a symbolic overlay of the laser spot as detected by the infrared camera. The use of a separate CMOS camera can enable a device such as the laser-based optical device 100 to use a more restrictive narrow band sun filter to filter out light from the sun, in some embodiments. This is because the image provided on a display (for example, the display 230 on the back of the laser-based optical device 100 or a display viewable from the eyepiece of a riflescope) is from the CMOS camera rather than the SWIR camera, thereby making the physical features of the scene more visable. It can be noted that in the embodiments that follow, although a "SWIR" camera is described, the techniques disclosed herein can be utilized with other types of infrared cameras (and in fact cameras that are configured to capture any type of light in nonvisible or partially visible EM spectra).

Figure 3B:
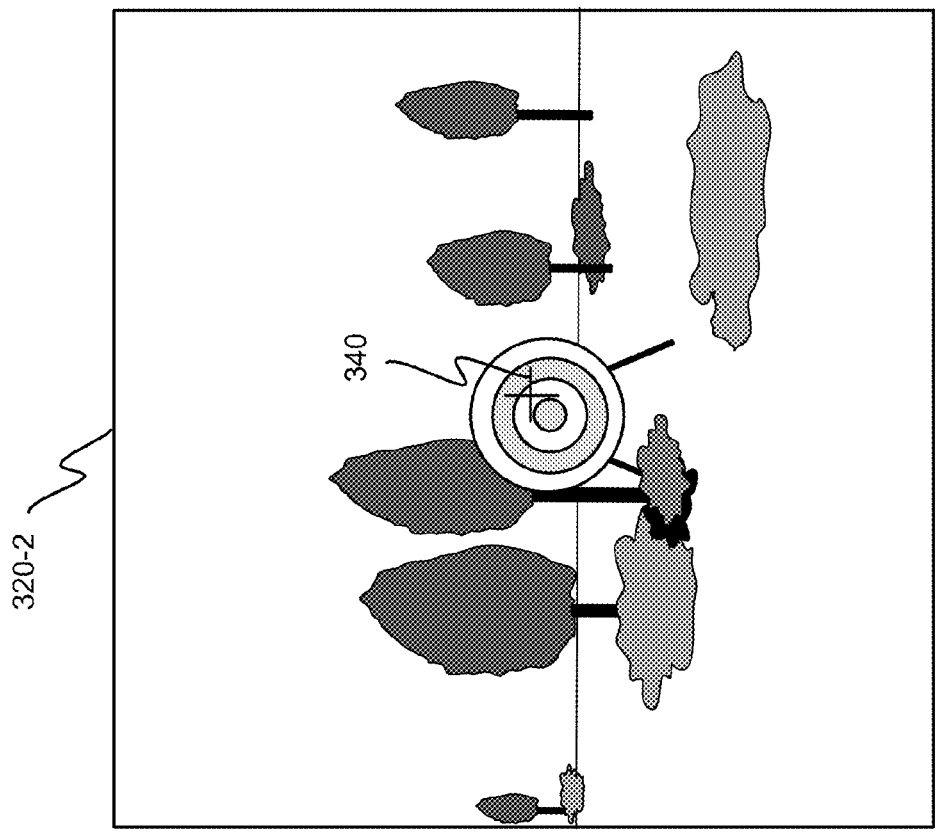
FIGS. 3A and 3B are simplified drawings of example images captured by a shortwave infrared (SWIR) camera and a complementary metal-oxide semiconductor (CMOS) camera, respectively.
Figure 3A:
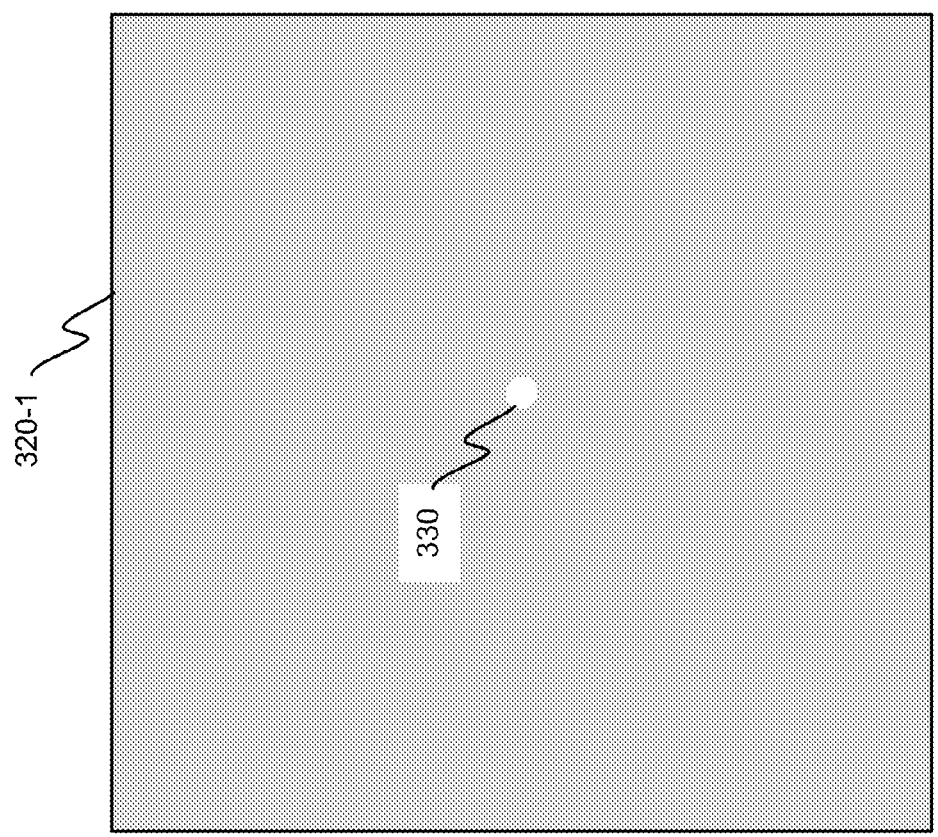

FIGS. 3A and 3B are simplified drawings of images 320-1 and 320-2 (collectively referred to herein as 320) captured by the SWIR and CMOS cameras, respectively, provided to help illustrate the benefits of utilizing a CMOS camera for bore sighting. The image 320-1 of FIG. 3A can represent the image captured by a SWIR camera on a cloudy day. Because a narrowband sun filter removes much of the target image content, overcast days (where there is no direct sunlight on a target) can result in image that has essentially no visible features other than the laser spot 330, which is very clearly seen (and detected using, for example, laser spot detection methods disclosed elsewhere herein). The optical path of the light directed toward the CMOS camera, however, may have no such narrowband sun filter (or other filter that would reduce the clarity of a visible-light image). This enables the CMOS camera to capture an image 320-2 with features viewable in visible light. (Other embodiments may additionally or alternatively employ other filters (or no filters at all).)

The optics utilized to provide both the SWIR and CMOS cameras can vary depending on desired functionality. For example, in some embodiments, light from an objective lens may be split by a beam splitter to divert infrared light to the SWIR camera in a manner similar to the beam splitting described in FIGS. 28A and 28B, discussed below, performed by beam splitter 2870. The diverted light can include a sun filter and/or other filters that may be beneficial to help determine where the laser spot is in the infrared image. The non-diverted light, comprising visible light, can then pass to the CMOS camera to enable the CMOS camera to capture an image of the visible light.

An electronic crosshair 340 or other representation can be overlaid on the image 320-2 captured by the CMOS camera, indicating where, within the image 320-1 the laser spot is located. This image 320-1 can be shown by a display of a device emitting the laser and/or shown in a display viewable through an eyepiece of a riflescope or spotting scope. Accordingly, the crosshair 340 can be utilized to bore sight the laser-based system to a riflescope or spotting scope.

In some embodiments, the field of view of the CMOS camera can be the same as the field of view of the SWIR camera. To help ensure that this is the case, the CMOS camera and the SWIR camera can be co-aligned at factory during manufacture. If the field of view and resolution are the same, then it will be easy to determine how the pixels of the SWIR camera correspond to the pixels of the CMOS camera. If the field of view and/or resolution of the cameras is/are different, then an offset, scaling, and/or other adjustment factor may be determined during factory configuration to determine how the pixels of the SWIR camera can be mapped to the pixels of the CMOS camera. Once the proper mapping is determined, the location of the crosshair 340 (during use of the laser-based device) in the image 320-1 of the CMOS camera can be easily determined depending on where in the corresponding image 320-1 of the SWIR camera the laser spot 330 is detected.

In certain embodiments, a laser-based optical device may include user settings to enable a user to configure the location of the crosshairs. In such embodiments, the location of the laser spot 330 may be adjustable (e.g., using Risley prisms to adjust the trajectory of the transmitted laser beam) and/or the position of the crosshair 340 may be adjustable (e.g., by using buttons on a user interface, an application of a mobile device connected with the laser-based optical device, etc.) to allow the user to move the location of the laser spot 330 and/or the location of the crosshair 340 until they are at corresponding positions within each image. In such embodiments, the laser-based optical device may further allow a user to toggle between images 320-1 and 320-2 and/or show both images simultaneously on a display. (As noted above, features in the image 320-1 captured by the SWIR camera may be hard to discern on cloudy days. Thus configuration by a user may need to be performed on sunny days or when conditions otherwise allow features to be sufficiently shown on the image 320-1 captured by the SWIR camera.)

During use (e.g., during a bore sighting mode of the laser-based optical device) the crosshair 340 can be placed automatically the image 320-2 captured by the CMOS camera. The position of the crosshair 340 can be continuously updated to the display (e.g. at 60 Hz) by software (e.g., executed by a processor of the laser-based optical device) that processes the infrared camera image and detects the pixel position of the laser spot 330 and with appropriate offset, scaling and/or other adjustments, places the (represented as a crosshair) on the LCD display.

Figure 4:
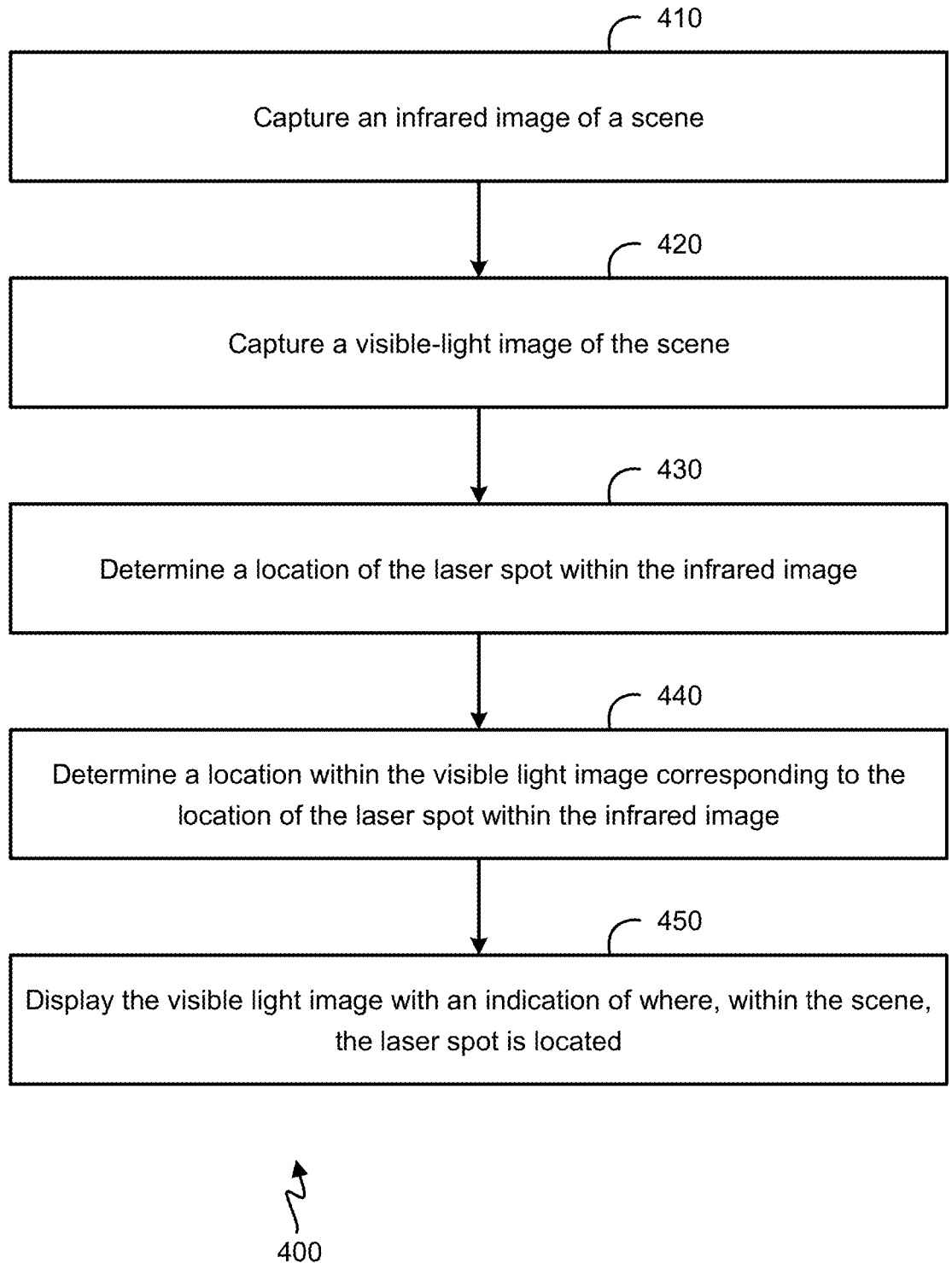
FIG. 4 is a flow diagram of a method of enabling bore sighting of an infrared laser using infrared and CMOS cameras, according to one embodiment.

FIG. 4 is a flow diagram of a method 400 of enabling bore sighting of an infrared laser using infrared and CMOS cameras, according to one embodiment. It can be noted that, in different embodiments, the functionality shown in the illustrated blocks may be different. Other variations may include combining or separating out the functions of various blocks, performing functions simultaneously, rearranging functions, and the like. A person of ordinary skill in the art will appreciate that various modifications can be made.

The method 400 can be performed by a laser-based optical device, such as the laser-based optical device 100 of FIG. 2. For example, a CPU or other processing unit can coordinate the functions of method 400 among various electronic components of the laser-based optical device. Such components can include, for example, a processing unit, a CMOS camera, an infrared camera, and an infrared laser transmitter. Other components can vary depending on functionality. Such components may include sensors, communication interfaces, and/or other components, similar to the components illustrated below in FIG. 17 of a low-cost laser-based optical device 1600.

At block 410, an infrared image of a scene is captured. As discussed herein above, the scene can include a laser spot caused by light reflected from a laser beam. The laser beam can be generated by a laser transmitter, which may be a component of the laser-based optical device performing the method 400. The infrared image of the scene can be captured by the infrared camera of the laser-based optical device.

At block 420, of visible light image of the scene is also captured. To help ensure the accuracy of the correlation between images, the functions performed at blocks 410 and 420 may be performed at substantially the same time. The visible light image of the scene can be captured by the CMOS camera of the laser-based optical device.

At block 430, the location of the laser spot within the infrared image is determined. According to some embodiments, the location of the laser spot may be automatically determined using image processing techniques. Examples of such techniques are provided herein below. The location of the laser spot within the infrared image may be determined as a pixel location (for example, an x, y coordinate of a pixel located at the center of the laser spot).

At block 440, a location within the visible light image corresponding to the location of the laser spot within the infrared image is determined. As previously indicated, there may be an adjustment factor to compensate for differences in the field of view, resolution, or other aspects of the CMOS and infrared cameras. Using this adjustment factor, and knowing the location of the laser spot within the infrared image, the location within the visible light image corresponding to the location of the laser spot within the infrared image can therefore be determined.

At block 450, the visible light image is displayed with an indication of where, within the scene, the laser spot is located. As previously indicated, the indication may be an image such as crosshairs or something else (a spot, an arrow, or other indicator). With this indicator, a user may use the visible light image to bore sight the laser-based optical device to another device, such as a weapon or optical scope on which the laser-based optical device is mounted.

Laser Spot Finding

According to some embodiments, techniques may be utilized to determine where, in an input image, a laser spot is located. Although described here in the context of use with a laser-based optical device (e.g., the laser-based optical device 100 of FIG. 2), techniques described herein may be utilized in other applications where a laser spot is to be located within one or more images.

Figure 5A:
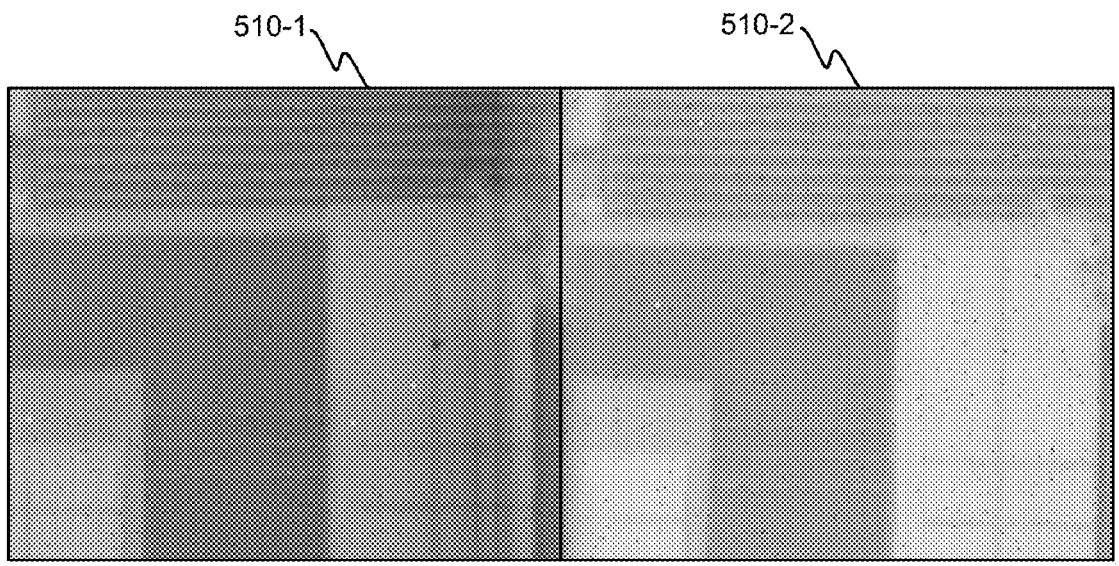

FIG. 5A shows left and right images, 510-1 and 510-2 respectively (collectively referred to herein as images 510), captured by a camera of a laser-based optical device 100. Although images 510 shown here, and in the embodiments below, were captured using a SWIR camera, it can be noted that the techniques for laser spot finding provided herein can be used on images from CMOS or other visible-light cameras.

Note that the grayscale shown in the images of FIG. 5A-11 has been inverted (e.g., white is shown as black, and vice versa) for replicability of the figures.

Figure 5B:
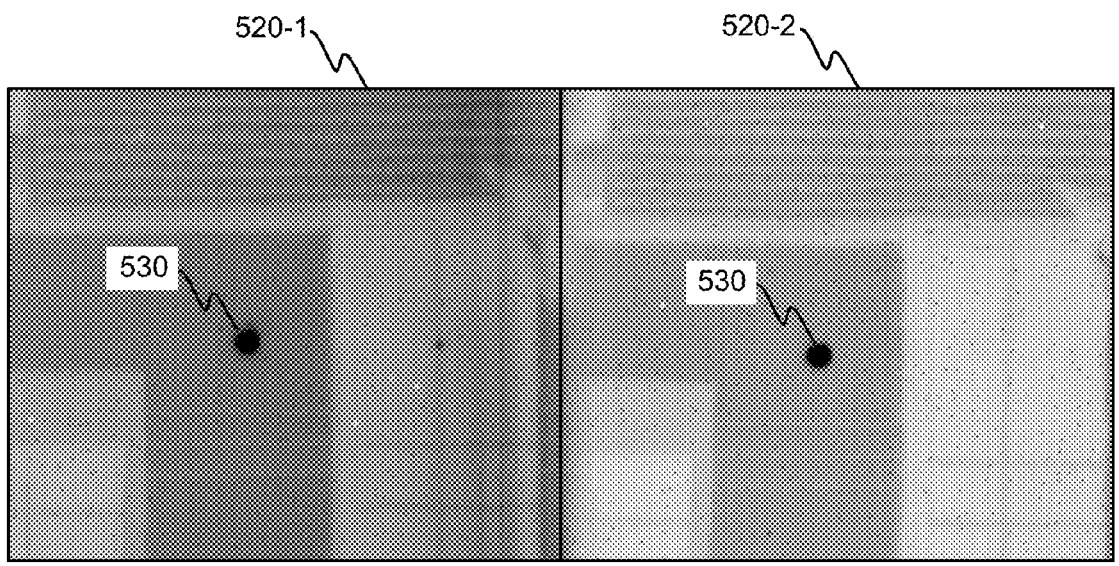

The scene captured and left and right images 510 is approximately the same, although there is a slight difference due to the difference in perspective, each of the stereoscopic inputs of the stereoscopic receiving optics 220. Images 510 were captured while the laser transmitter was off, therefore a laser spot is not present within these images 510. FIG. 5B, on the other hand, shows left and right images, 520-1 and 520-2 respectively (collectively referred to herein as images 520), were captured while the laser transmitter was on and therefore show a laser spot 530. In some embodiments, each of the stereoscopic inputs of the stereoscopic receiving optics 220 may include a narrow-band sun filter to help reduce the amount of sunlight (and other light) that is captured by the SWIR camera, which can help ensure that the laser spot 530 is the brightest object in the images 520.

The task, then, is to determine where the laser spot 530 is within each of these images. An initial step comprises background subtraction, for example subtracting images 520, images 510. This can eliminate static background elements from both sets of figures, making the laser spot 530 easier to find. However, there are several issues that typically need to be addressed in order to find the laser spot 530, even after background subtraction. Such issues can include, for example, noise caused by dead or malfunctioning pixels or movement in the images that can be caused by wind or shimmering. To resolve these issues, embodiments can employ various techniques such as background subtraction, image averaging, and image filtering. These issues are described in more detail below.

Figure 7:
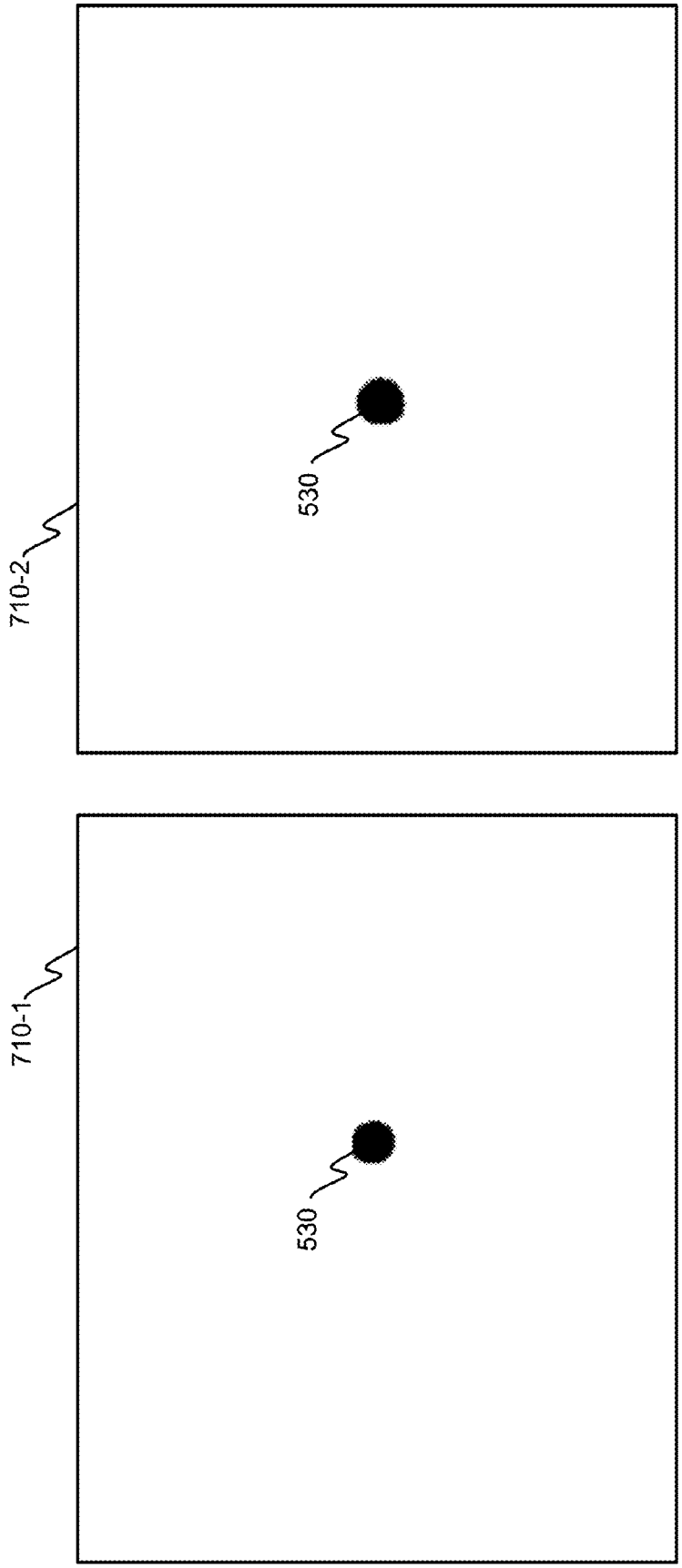

FIG. 6 shows left and right images, 610-1 and 610-2 respectively (collectively referred to herein as images 610) after background subtraction has removed static background elements. As can be seen, the images 610 include not only the laser spot 530, but a large number of smaller spots (unlabeled). The smaller spots can be due to dead pixels, which can be a common occurrence in SWIR cameras, given currents manufacturing standards. The spots, however, can be eliminated using the image processing (background averaging and Gaussian filtering) techniques described herein. FIG. 7 shows left and right images, 710-1 and 710-2 respectively, corresponding to images 610, but after implementing the image processing techniques described below. As can be seen, the smaller spots are substantially eliminated.

Figure 8:
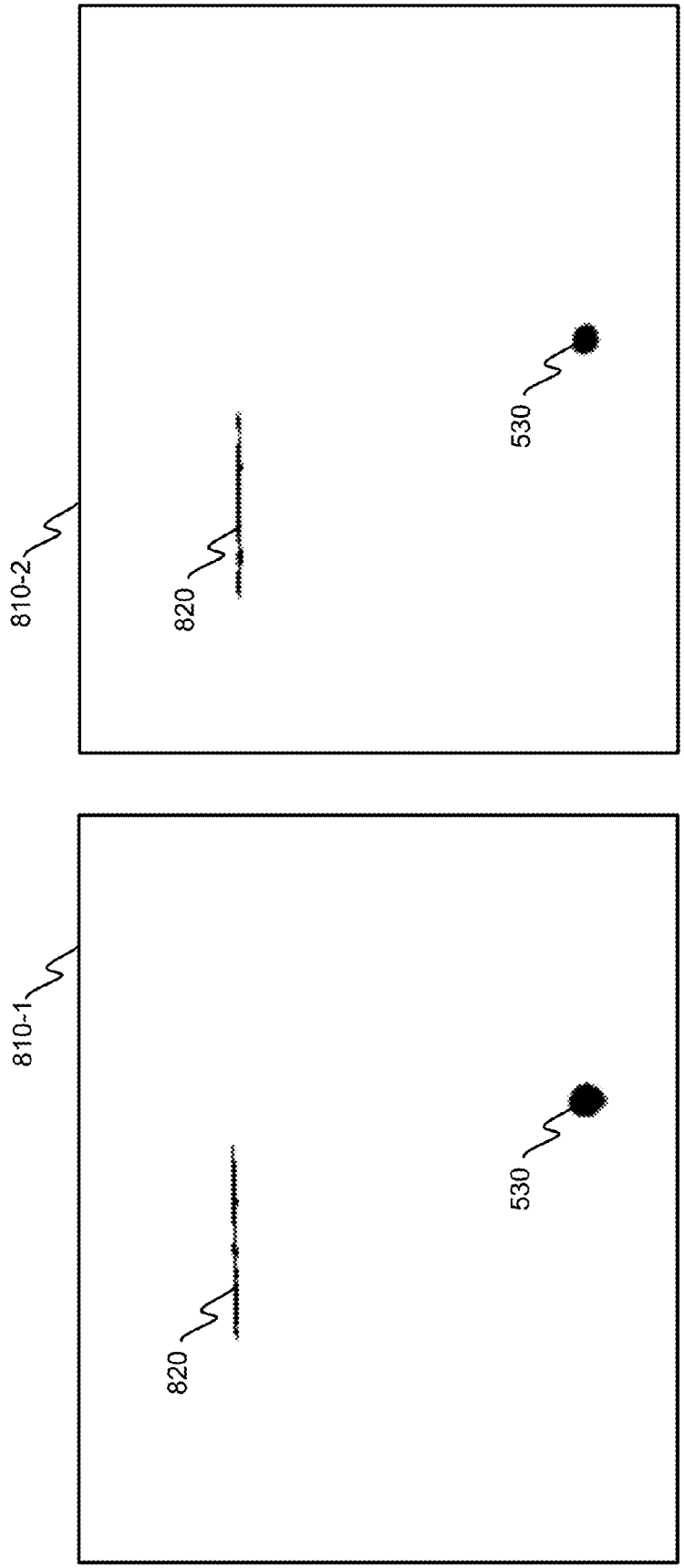
Figure 9:
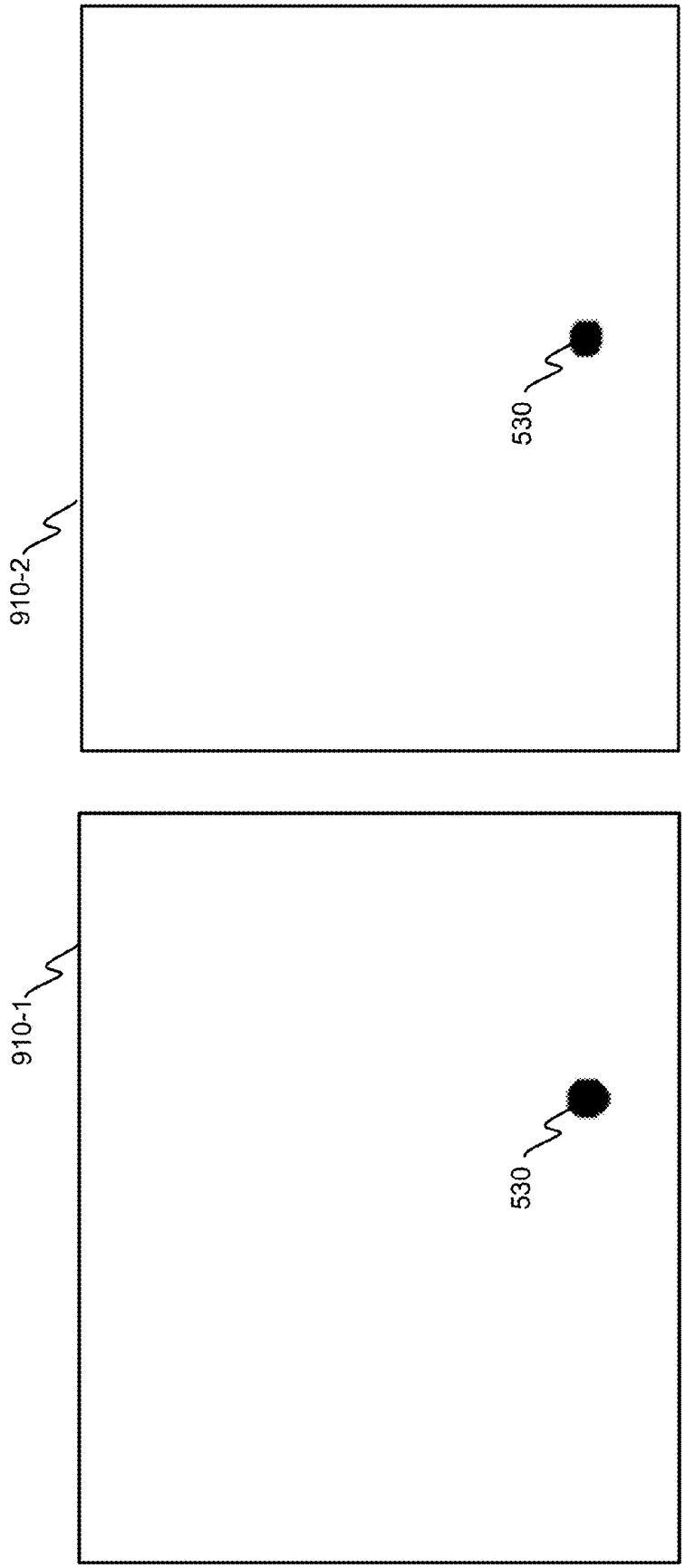

FIG. 8 shows left and right images, 810-1 and 810-2 respectively (collectively referred to herein as images 810), again after background subtraction. As can be seen, the images 810 include not only the laser spot 530, but also one large strip 820 of pixels. The strip 820 of pixels may be caused by the light shimmering off of a reflective surface. Because light shimmers differently at different times, this strip 820 may not be eliminated by background subtraction of two frames. However, these strips 820 may be eliminated using the techniques provided herein. FIG. 9 shows left and right images, 910-1 and 910-2 respectively, corresponding to images 810 after implementing the image processing techniques described below. As can be seen, the strips are removed.

Figure 10:
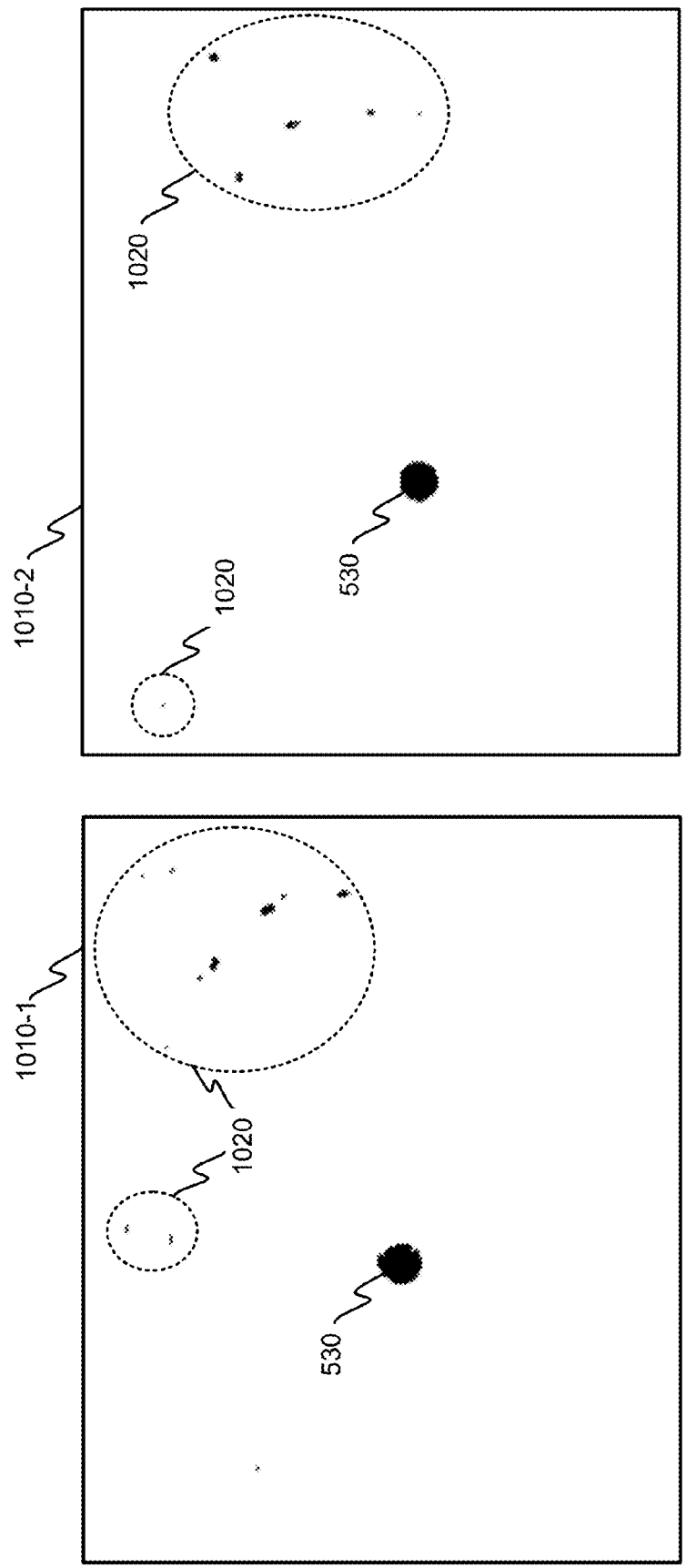
Figure 11:
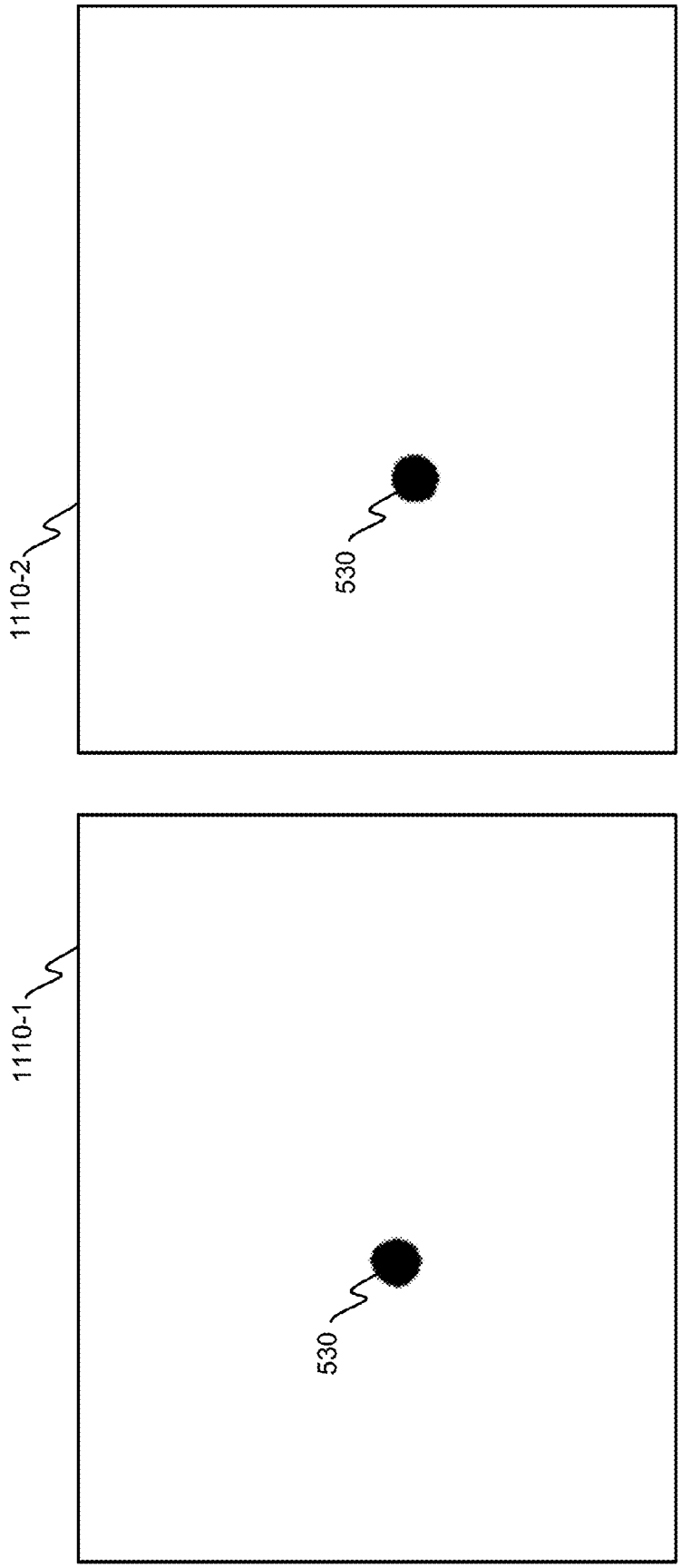

FIG. 10 shows left and right images, 1010-1 and 1010-2 respectively (collectively referred to herein as images 1010) after background subtraction. Here, images 1010 include the laser spot 530 as well as areas 1020 having patches of pixels contrasting with the background. These pixels appear after background subtraction due to movement (or "clutter") in the areas 1020 (e.g., a tree moving due to wind). Again, these pixels can be eliminated using the techniques provided herein. FIG. 11 shows left and right images, 1110-1 and 1110-2 respectively, corresponding to images 1010 after implementing the image processing techniques described below. As can be seen, the patches of pixels are removed.

Figure 12:
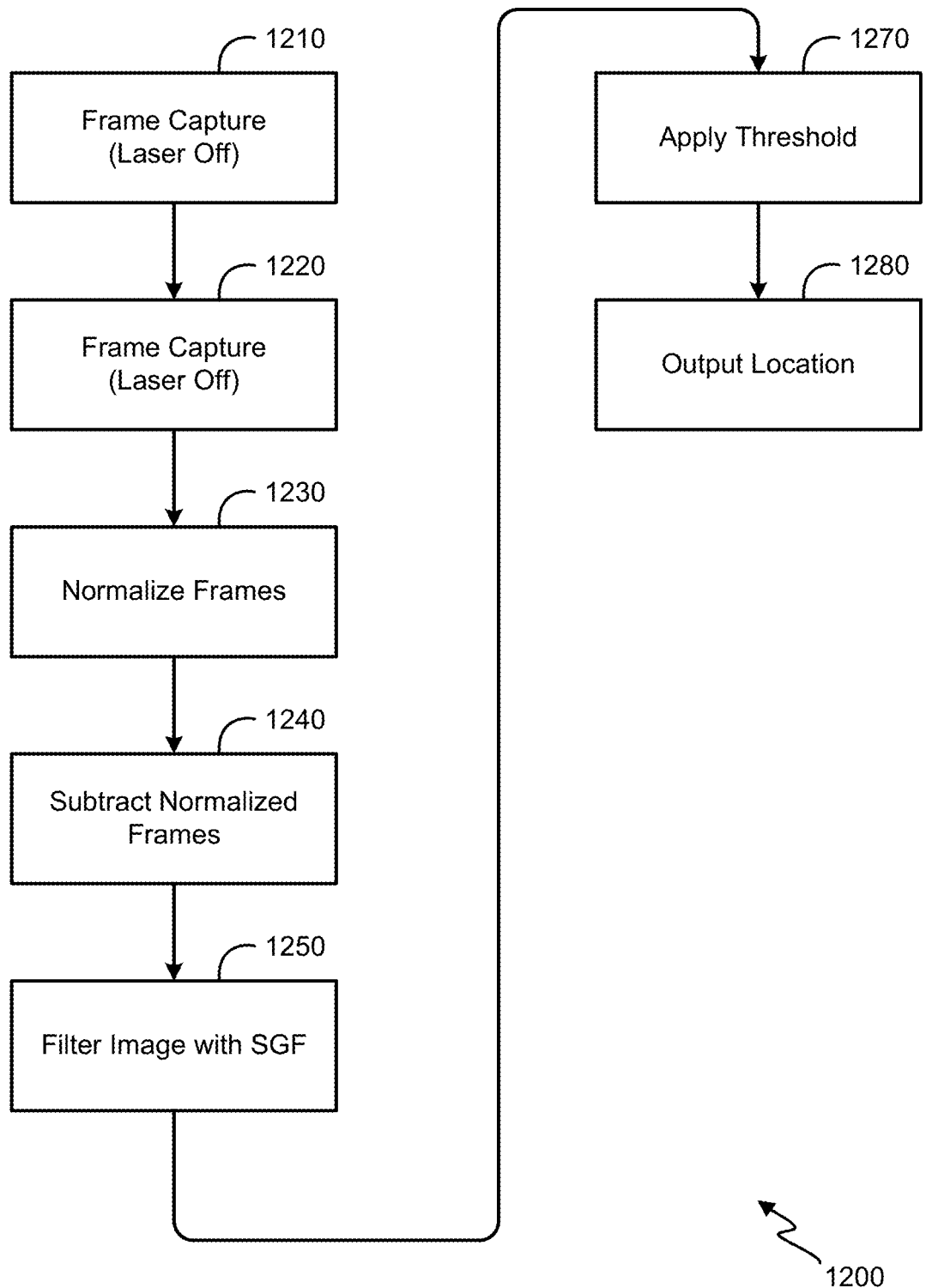
FIG. 12 is a flow diagram 1200 and illustrating the general process of capturing and processing images to determine the location of the laser spot 530, according to one embodiment.

FIG. 12 is a flow diagram 1200 and illustrating the general process of capturing and processing images to determine the location of the laser spot 530, according to one embodiment. It will be appreciated that the flow diagram 1200 of FIG. 12 is provided as an example. Alternative embodiments may add, subtract, combine, separate, or otherwise vary the functions shown. It is further acknowledged that, although embodiments described herein are directed toward finding a laser spot in a pair of stereoscopic images, embodiments are not so limited. The techniques herein can, for example, be applied to a single image.

The flow starts at blocks 1210 and 1220 where frames are captured with the laser off in the laser on, respectively. As shown in FIGS. 5A-5B, image captures should be all substantially the same scene. This can facilitate subsequent background subtraction. To help ensure that substantially the same scene is captured at blocks 1210 and 1220, the frames captured at these blocks are typically sequential. In other words, the camera may capture one large block of frames in which the laser is on for only part of the time.

To facilitate the subsequent normalization of frames (in block 1230), many frames may be captured. In some embodiments, tens of frames, hundreds of frames, or more may be captured at each of blocks 1210 and 1220.

At block 1230, frames are normalized. To be specific, pixel values for the frames captured when the laser was off (at block 1210) are averaged to create a first composite frame representing frames captured when the laser was off. Similarly pixel values for the frames captured when the laser was on (at block 1220) are averaged to create second composite frame representing frames captured when the laser was on. In so doing, changes in pixel values from one frame to the next caused by noise, movement, or shimmering will be averaged out.

At block 1240, the composite frames are subtracted to create a difference image. That is, the pixel values of the first composite frames are subtracted from corresponding pixel values of the second composite frame, or vice versa. This provides a background subtraction, removing the background elements that are common between both composite frames and leaving the few remaining items that are different between the composite frames, such as the laser spot. Because of the normalization or averaging that took place at block 1230, values of pixels affected by noise, movement, or shimmering will be similar between the two composite frames. Therefore, many of the issues that arise due to noise, movement, or shimmering will be alleviated in blocks 1230 and 1240. As such, these functions serve to increase the likelihood that the laser spot 530 will be found within the difference image.

It will be understood that some additional image processing me take place. In some embodiments, for example, additional image processing may occur to help ensure the composite frames are properly aligned before the frames are subtracted in block 1240. Additionally or alternatively, a threshold filter may be applied so the pixels with low values (e.g., where pixel values of the composite frames were close but not exact) can be reduced to zero.

At block 1250, a spatial Gaussian filter (SGF) is applied to the difference image to filter out noise that does not have a Gaussian footprint. In some embodiments this comprises processing an image row by row with the SGF that matches an expected to spatial width of the laser spot. Additionally or alternatively, embodiments may the process and the image column by column in the same manner. Because the laser forms a Gaussian laser spot, the SGF is essentially tuned to identify the laser spot within the difference image. To help ensure the laser spot in the image is Gaussian, the embodiments may alter the integration time of the frame captures in blocks 1210 and 1220 and/or adjust the brightness and/or adjust contrast of the captured frames so that the captured images are not overly saturated.

Figure 13:
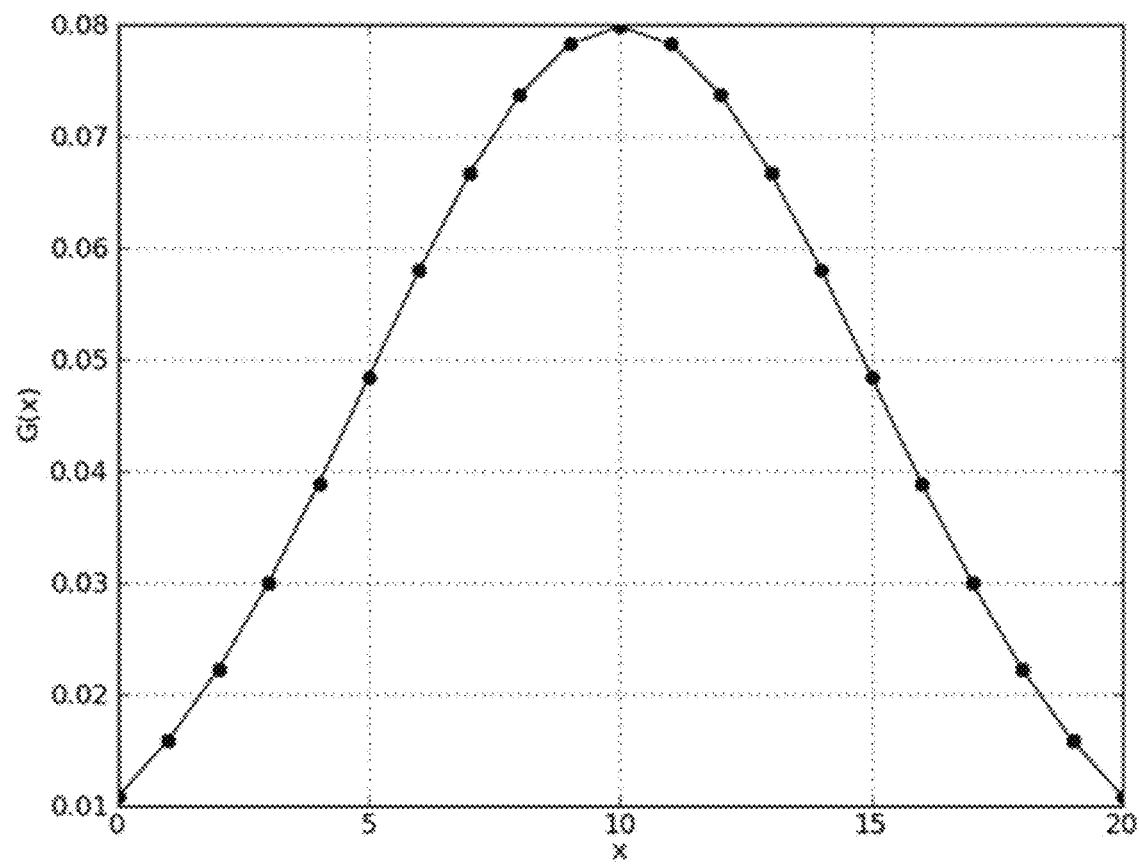
FIG. 13 is an example of a spatial Gaussian filter (SGF) that could be applied to a difference image.

FIG. 13 is an example of an SGF that could be applied to the difference image. Here, the SGF is approximately 20 pixels wide. However, in other embodiments, the filter may be larger or smaller depending on the resolution of the camera, the expected size of the laser spot, and/or other similar factors. The size of the filter can depend on the size of the expected laser spot in the image. Therefore, in some embodiments, the range of the target and or the known diffraction rate of the laser can be taken into account to determine the width of the SGF. In some embodiments, the difference image may be processed using SGFs of different widths, to help ensure the laser spot is found. In some embodiments, calibration can be conducted at a given range so that the size of the laser spot is known. (For example, FIGS. 5A-5B were obtained at a distance of 500 m, where the laser spot is known to be 4-6 pixels wide—although images may make the laser spot seem bigger due to blooming and/or saturation effects.) Additionally or alternatively, calibration can take place within a known range of distances and different SGFs may be applied based on the range of possible spot sizes resulting from calibration within the known range of distances.

Figure 14A:
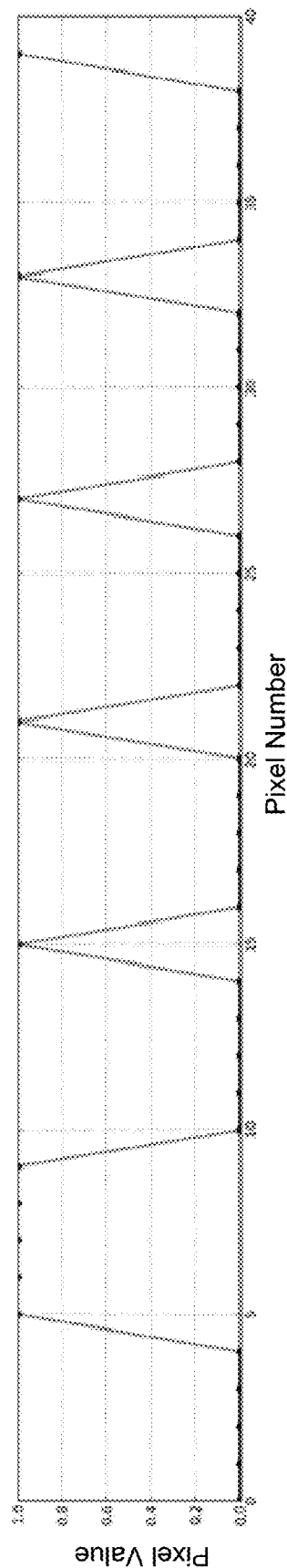
FIGS. 14A and 14B are graphs showing pixel values (e.g., luminosity values) as a function of pixel numbers in a row of an image in which the laser spot is located.
Figure 14B:
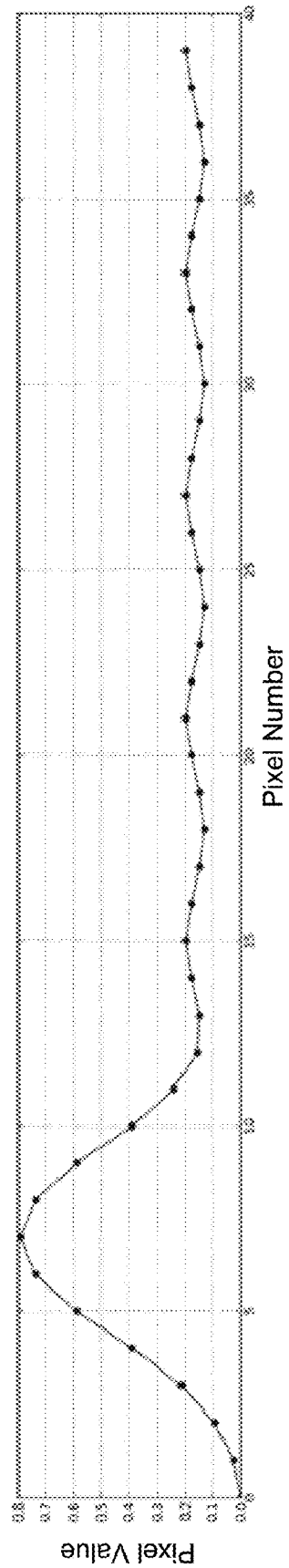

FIGS. 14A and 14B are graphs showing pixel values (e.g., luminosity values) as a function of pixel numbers in a row of an image in which the laser spot is located. As shown in FIG. 14A, a large spot is located between pixel numbers 4 and 10. However, there are a series of additional pixels having high pixel values that follow. FIG. 14B, shows pixel values for the same pixel numbers as FIG. 14A, but after the SGF is applied. As can be seen, the larger spot located between pixel numbers 4 and 10 forms a Gaussian curve, while the smaller spots or significantly reduced and value. Thus, the larger spot is the only location in this row of pixels having a pixel value greater than 0.2. Accordingly, large Gaussian in spots may be discovered after the SGF is used by applying a threshold to determine which pixel values are greater than and/or equal to the threshold.

Returning to FIG. 12, a threshold is applied at block 1270. In other words, the difference image, now filtered by the SGF, is processed to determine pixels with values that exceed a certain threshold. (In the example of FIG. 14B, the threshold may be, for instance, a value of 0.5.) Given the functions previously performed on the difference image, pixels that exceed the threshold are pixels where the laser spot is located. In some embodiments, additional precautions may be taken to help ensure that it is indeed the laser spot. For example, a location in the image having a threshold width and/or height of pixels whose values exceed the threshold value may be determined.

At block 1280, the determined location of the laser spot is provided. In some embodiments, the location may be the location of a pixel in the center of the laser spot (e.g., a pixel location, by row and column (x, y)). In some embodiments where a stereoscopic optical receiver is utilized, a single SWIR camera may capture left and right images simultaneously. Left and right images may therefore be extracted from a single larger image. In such embodiments, the functions of a process 1200 may be utilized to find two laser spots, one for the last image and one for the right image. Such embodiments may additionally provide two output locations at block 1280.

As briefly described above, image captured during wind sensing may require a high frame rate. In some embodiments, the frame rate may be 700 fps or more. As such, a bounding box may be defined to allow the camera to only output a portion of the total pixels captured, thereby reducing the amount of bandwidth needed per frame, and increasing the amount of frames the camera is able to output per second. Thus, in some embodiments, once the location of the laser spot is provided at block 1280, a bounding box is defined to be large enough to capture the laser spot at different operating distances, and accommodate fluctuations in the location of the laser spot due to turbulence or other anomalies. The bounding box is then utilized when the laser-based optical device 100 is subsequently used for wind sensing, where the bounding box defines a window within an image captured by the camera that will be processed for wind sensing. In practice, extracting wind sensing measurements from a bounding box that encompass is the laser spot, rather than from the laser spot only, has been a reliable technique for determining wind measurements. Other portions of the image that do not include the laser spot are not utilized in obtaining wind measurements. It should be noted that, although a "box" as described herein, embodiments may alternatively use regions of other shapes.

Figure 15:
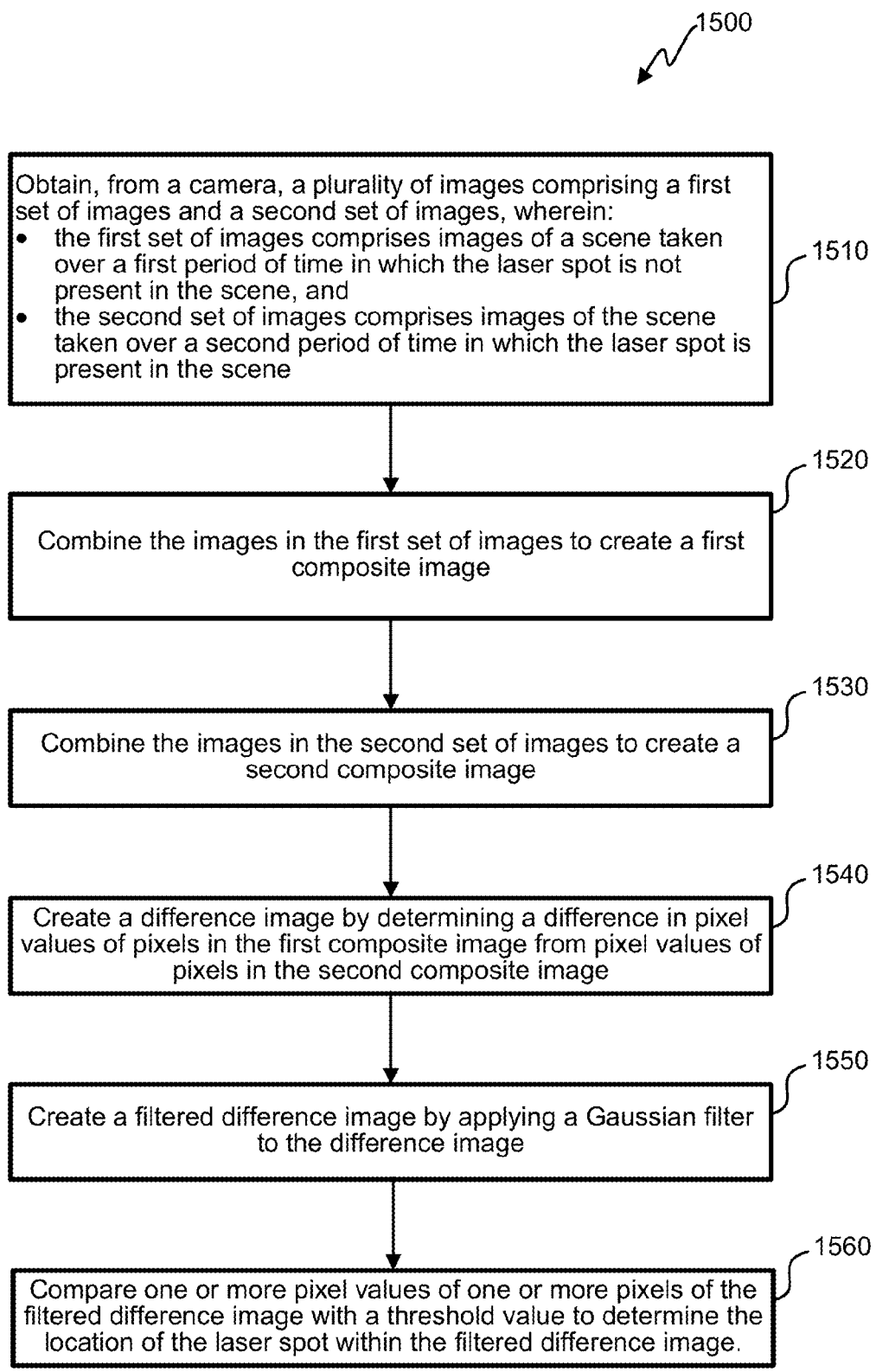
FIG. 15 is a flow diagram of a method of determining the location of a laser spot in an image, according to an embodiment.

FIG. 15 is a flow diagram of a method 1500 of determining the location of a laser spot in an image, which can be implemented by a device such as the laser-based optical device 100 of FIG. 1. As with other images provided herein, FIG. 15 is a non-limiting example. Alternative embodiments may vary from the functionality illustrated. It can be noted that the blocks illustrated in FIG. 15 provide functionality similar to aspects of the functionality illustrated in the process 1200 of FIG. 12. As such, at least portions of the methods 1200 and 1500 may overlap.

At block 1510, the method includes obtaining, from a camera, a plurality of images comprising a first set of images and a second set of images, wherein the first set of images comprises images of a scene taken over a first period of time in which the laser spot is not present in the scene, and the second set of images comprises images of the scene taken over a second period of time in which the laser spot is present in the scene. As indicated earlier, the first set of images and the second set of images may be taken in sequence to help ensure that the first set of images and a second set of images are of substantially the same scene.

The functionality of blocks 1520 and 1530 comprises combining the images in the first set of images to create a first composite image and combining the images in the second set of images to create a second composite image, respectively. As noted previously, the composite image for a given image set may comprise pixels that have an average pixel value for corresponding pixels in each of the images of the given image set. Pixel values for the composite image media can be determined in alternative ways according to some embodiments, such as a mean pixel value or weighted average.

At block 1540, a difference image is created by determining a difference in pixel values of pixels in the first composite image from pixel values of pixels in the second composite image. As noted above, this can comprise subtracting pixel values of one composite image from corresponding pixel values from the other composite image.

At block 1550, a filtered difference image is created by applying a Gaussian filter to the difference image. In the embodiments above, and SGF was used. Other embodiments may use other types of Gaussian filters. Moreover, techniques of applying that the Gaussian filter may vary. In some embodiments, for example, the Gaussian filter may be applied row by row. In some embodiments, the Gaussian filter may be applied column by column.

At block 1560, one or more pixel values of one or more pixels of the filtered difference image are compared with a threshold value to determine the location of the laser spot within the filtered difference image. As noted with regard to FIG. 14B, this can provide for a determination of the location of a Gaussian laser spot where noise and other features of the difference image have been filtered out.

Additional aspects may vary, depending on desired functionality. For example, some embodiments may further comprise finding a center location of the laser spot, representative of the location of the laser spot within the filtered difference image. This center location may be represented by (x, y) coordinates of a pixel value within the filtered difference image. Some embodiments may further comprise defining a bounding region within the filtered difference image (where the bounding region comprises a region in which the laser spot is determined to be located), and altering subsequent operation of the camera such that the camera does not provide pixel data from pixel sensors corresponding to pixels outside the bounding region for at least one subsequent image captured by the camera. Additionally or alternatively, a size of the bounding region may be determined based on a determined the size of the laser spot within the filtered difference image. In some embodiments for example, a width of the bounding box (or radius of a circular bounding region) may be a function of a determined width of the laser spot (e.g., the width of the widest portion of the laser spot in terms of pixels whose values exceed a threshold value). Finally, as noted in certain embodiments above, the camera may be configured to provide two stereoscopic images at a time (e.g., a right image and a left image, both captured simultaneously by the pixel sensor array of the camera).

Although embodiments of the laser-based optical device 100 have been described as comprising the SWIR camera to provide for wind sensing measurements with an IR laser (e.g., at a wavelengths of 1550 nm or 904 nm), wind measurements may be obtained in a similar manner using one or more CMOS cameras to detect visible laser spots from visible-light lasers. Such embodiments may utilize lasers that function at a wavelength of approximately 600 nm, for example. Alternatively, as shown below, other sensors may be utilized instead of cameras.

Because the SWIR camera can be exceptionally expensive (a single camera costing tens of thousands of dollars), alternatives to the laser-based optical device 100 may incorporate various lower-cost parts to help reduce overall cost. Such a lower cost embodiments may further take advantage of equipment that users may already have. Such embodiments are provided in further detail below.

Low-Cost Multifunction Wind and Range Measurement with Ballistic Computer

Figure 16:
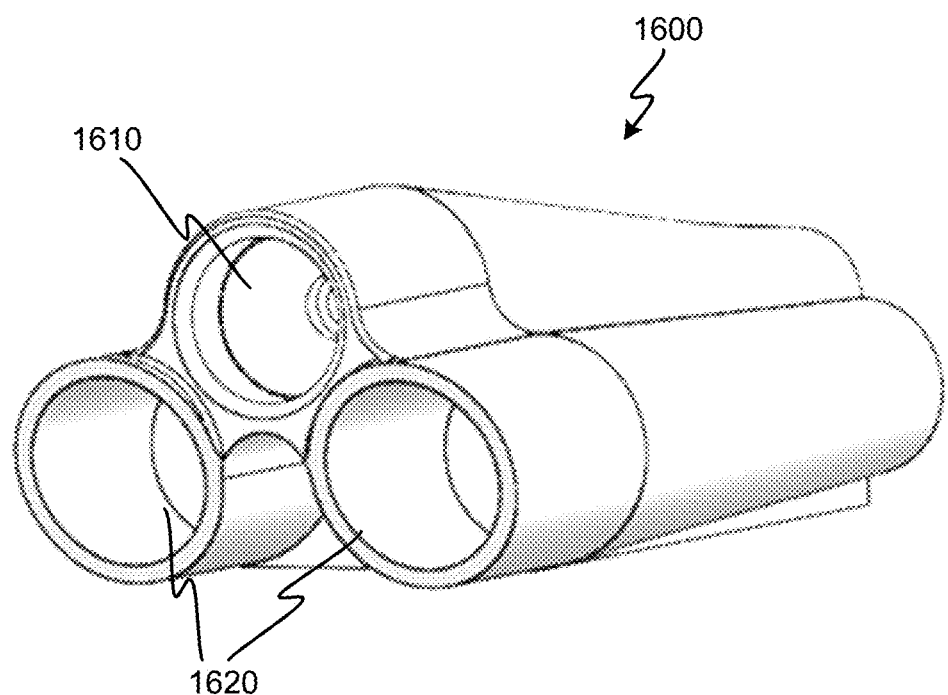
FIG. 16 is a perspective view of an embodiment of a laser-based optical device.

FIG. 16 is a perspective view of an embodiment of a low-cost laser-based optical device 1600, with functionality similar to the laser-based optical device 100 of FIG. 2. (It is acknowledged that the term "low cost" is relative. And indeed, the low-cost laser-based optical device 1600 can be made at a relatively lower cost than the laser-based optical device 100 of FIG. 2. Here, the term "low cost" is used to differentiate the device illustrated in FIG. 16 from the device disclosed in earlier embodiments, and is not meant as a limitation on cost.) That is, the low-cost laser-based optical device 1600 is capable of taking laser-based range and wind measurements, along with providing other (non-laser-based) measurements. Size, weight, shape, and/or other traits can vary, depending on desired features.

As shown in FIG. 16, embodiments of the low-cost laser-based optical device 1600 can include optics 1610 through which a laser light is transmitted, and stereoscopic receiving optics 1620 through which reflected laser light is received. The optics and/or other materials used in the low-cost laser-based optical device 1600 can be similar to those of the laser-based optical device 100 of FIG. 2.

Figure 17:
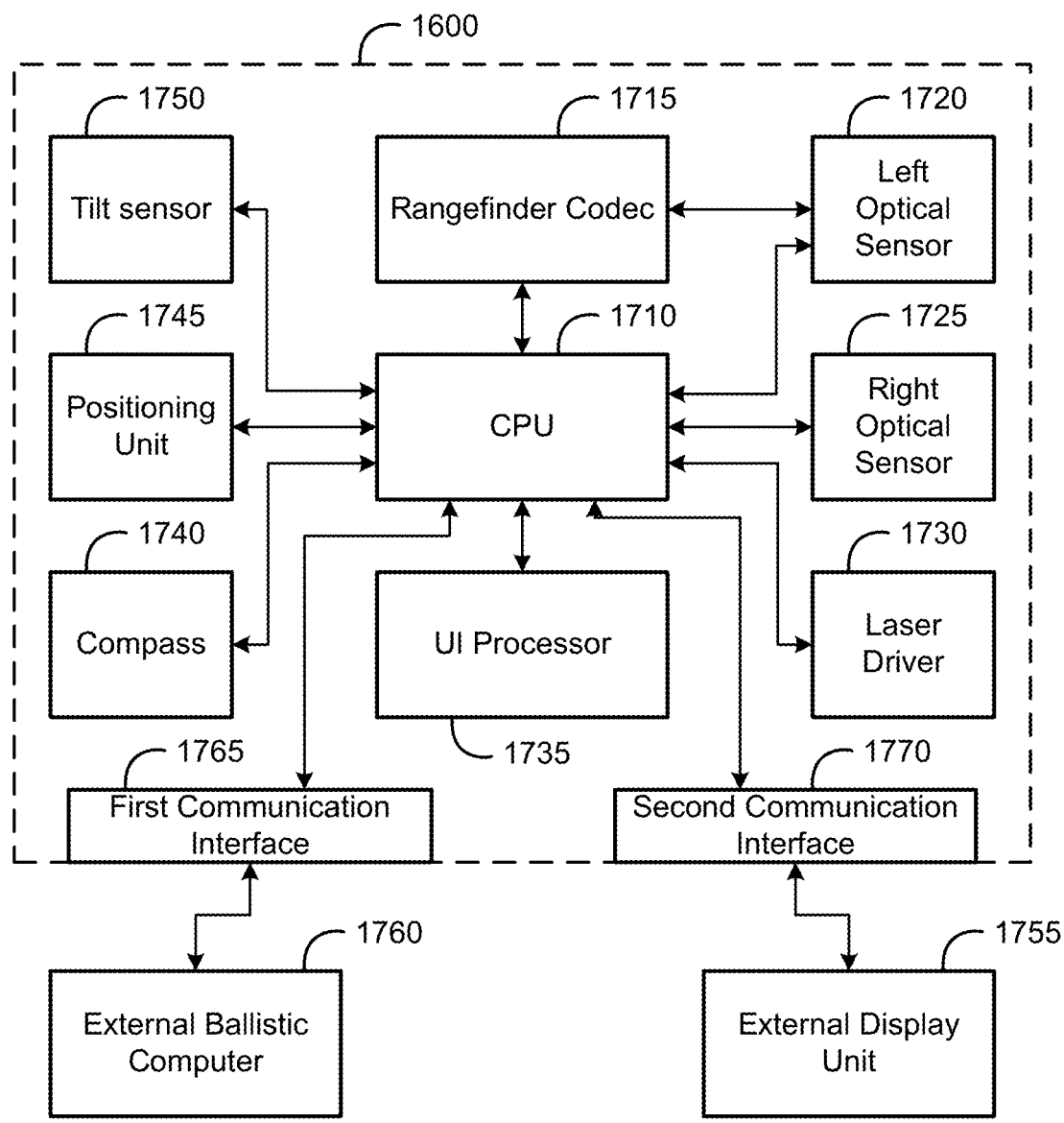
FIG. 17 is a simplified block diagram illustrating various components of a laser-based optical device, according to one embodiment.

FIG. 17 is a simplified block diagram illustrating various components of a low-cost laser-based optical device 1600, according to one embodiment. Components can include, among other things, the central processing unit (CPU) 1710, a rangefinder codec 1715, the left optical sensor 1720, a right optical sensor 1725, a laser driver 1730, the user interface (UI) processor 1735, a compass 1740, a positioning unit 1745, and a tilt sensor 1750. Here, the low-cost laser-based optical device 1600 is communicatively coupled with an external ballistic computer 1760 via a first communication interface 1765 and coupled to an external display unit 1755 via a second communication interface 1770.

As with other figures provided herein, embodiments are not limited to the components shown in figure. Variations may include combining were separating various components, adding or omitting components, and the like. Depending on desired functionality, embodiments may include an internal power source such as a battery, and/or utilize an external power source.

In the embodiment illustrated, the CPU 1710 is communicatively coupled to a controls many of the other components. Processing is further divided between the CPU 1710 and other processors, including the UI processor 1735 and the rangefinder codec 1715. It can be noted, however, that processing may be further consolidated or distributed, depending on desired functionality. In the embodiments below, the term "processing unit" may refer to the CPU 1710, the UI processor 1735, the rangefinder codec 1715, or any combination of the three (including all three collectively).

Depending on desired functionality, the processing unit may comprise one or more of an application specific integrated circuit (ASIC), a field programmable gate array (FPGA), a general purpose processor, or the like. The UI processor 1735 may be communicatively coupled with a user interface (not shown), such as buttons, switches, a touchscreen, indoor other input/output devices, providing for communication between a user and low-cost laser-based optical device 1600. In some embodiments, the UI processor 1735 may be communicatively coupled with a wired or wireless interface, which can enable the low-cost laser-based optical device 1600 to communicate with another device. (Such a wireless interface may comprise and/or be incorporated into the first communication interface 1765 and/or the second communication interface 1770. Alternatively wireless interface may be separate from these two communication interfaces.) For example, in some embodiments, the UI processor 1735, coupled with the wireless interface, may enable a user to configure the low-cost laser-based optical device 1600 using a mobile device (e.g., a smart phone) that communicates with the low-cost laser-based optical device 1600 wirelessly via the wireless interface.

This CPU 1710 is in communication with a laser driver 1730 to control the output of the laser for range finding and wind sensing measurements. Here, the laser driver 1730 comprises circuitry configured to operate a laser. In other embodiments, the laser driver 1730 may be incorporated into the laser itself (not shown) and/or the CPU 1710. The laser itself can comprise any of a variety of lasers with accompanying collimating optics to provide the desired wavelength, diffraction, and other optical traits to enable range finding and wind sensing measurements at operating distances. One such laser may comprise a laser having a Fabry-Perot seed laser and a pump laser combined with an optical fiber amplifier. Additional information regarding such a laser is provided in U.S. patent application Ser. No. 13/945,537, filed on Jul. 20, 2013, entitled "Compact Laser Source," which is incorporated by reference herein in its entirety.

The low-cost laser-based optical device 1600 may further comprise stereoscopic receiving optics, which can include a left optical sensor 1720 and a right optical sensor 1725. The stereoscopic receiving optics can be similar to those found in the laser-based optical device 100 illustrated in FIG. 2 and described in the '004 application. Here, however, rather than utilizing the camera, such as the SWIR camera of the laser-based optical device 100, the left optical sensor 1720 and the right optical sensor 1725 may each comprise a photodiode, such as an avalanche photodiode or a PIN photodiode. Here, both the left optical sensor 1720 and the right optical sensor 1725 provide output to the CPU 1710 for wind measurement calculation.

For range finding measurements, only one of the optical sensors needs to be utilized. In FIG. 17, the left optical sensor 1720 is shown to be in communication with the rangefinder codec 1715. In other embodiments, it may be the right optical sensor 1725. In some embodiments, both sensors may be in communication with the rangefinder codec 1715, and only one used at a time to measure range.

As noted below, an optical sensor may need to have specialized circuitry in order to enable it to function for both wind sensing and range finding of functions. Such circuitry can be incorporated into the sensor itself, as described in more detail below.

For its part, the rangefinder codec 1715 coordinates with the CPU 1710 to make range finding measurements. The CPU 1710 causes the laser driver 1730 to generate laser pulses that enable range finding measurements to be taken. The rangefinder codec 1715 then receives, via the left optical sensor 1720, measurements of the laser light reflected off of the target. The rangefinder codec 1715 then uses an algorithm to determine the range from the measurements. The range can then be provided to the CPU 1710.

The CPU 1710 may further gather additional sensor information from the tilt sensor 1750, positioning unit 1745, and the compass 1740. The tilt sensor 1750 can comprise, for example, a gyroscope capable of determining a degree of tilt (e.g., with respect to gravity or the earth's surface) at which the low-cost laser-based optical device 1600 is oriented. The tilt sensor 1750 may comprise alternative or additional sensors capable of determining the tilt of the low-cost laser-based optical device 1600. The positioning unit 1745 can comprise a satellite positioning receiver, for example, to determine an absolute or relative position of the low-cost laser-based optical device 1600 for ballistic calculations. In some embodiments, the positioning unit 1745 comprises and global positioning system (GPS) receiving unit capable of determining an absolute position of the low-cost laser-based optical device 1600 (e.g., coordinates in latitude and longitude). The compass 1740 can comprise a magnetic, celestial, or other compass capable of determining the orientation of the low-cost laser-based optical device 1600 (e.g., in degrees) with respect to the geographic cardinal directions.

Measurements from the tilt sensor 1750, positioning unit 1745, and a compass 1740, together with wind and range measurements taken of the target can be utilized to determine a ballistic solution for firing a weapon at the target. According to embodiments herein, this information may be provided to an external ballistic computer 1760 via the first communication interface 1765 so that the external ballistic computer 1760 can calculate the ballistic solution. Such embodiments can be advantageous because many snipers in the field already utilize an external ballistic computer 1760. And thus, calculating a ballistic solution internal to the low-cost laser-based optical device 1600 could be duplicative.

An external ballistic computer 1760 can receive the information provided by the low-cost laser-based optical device 1600 via the first communication interface 1765 and utilize that information, together with other information, to calculate the ballistic solution. Such other information can include, for example, temperature, humidity, and or other factors that could impact the ballistic solution. This can be advantageous in situations where the low-cost laser-based optical device 1600 may be in direct sunlight and/or the internal temperature and/or humidity of the low-cost laser-based optical device 1600 is impacted by the processing unit and/or and other components, in which case utilizing external sensors to measure the temperature and humidity may be more accurate. Nonetheless, according to some embodiments, temperature and/or humidity sensors may be included in the low-cost laser-based optical device 1600.

An external ballistic computer 1760 may include a temperature and/or humidity sensors. Additionally or alternatively, the external ballistic computer 1760 may enable a user to input the temperature or humidity manually via the user interface. External ballistic computers capable of calculating a ballistic solution are widely used in the field, and therefore often readily available to users. They can enable users to input a type of firearm and ammunition, utilizing that input, as well as data from sensors and the low-cost laser-based optical device 1600 to determine a ballistic solution. Examples of such external ballistic computers 1760 include ballistic solvers made by KESTREL and RAPTOR.

Depending on desired functionality, the external ballistic computer 1760 may communicate with the first communication interface 1765 in any of a variety of ways. According to some embodiments, for example, the communication may be carried out wirelessly via Bluetooth and/or other wireless radio frequency (RF) technologies. In some embodiments, wireless communication may be implemented via an IR interface. In some embodiments, communication may be implemented via wired communication, such as an RS252 serial port.

According to some embodiments, the external ballistic computer 1760 can then compute the ballistic solution and provide the ballistic solution back to the low-cost laser-based optical device 1600 via the first communication interface 1765. According to some embodiments, the ballistic solution comprises an offset aim point, which the low-cost laser-based optical device 1600 can then the aim point to an external display unit 1755 via the second communication interface 1770. Communication between the second communication interface 1770 and the external display unit 1755 can be wired and/or wireless, utilizing the wireless and/or wired technologies similar to those described with respect to the communication between the first communication interface 1765 and the external ballistic computer 1760.

In some embodiments the external display unit 1755 may be integrated into and/or coupled with a weapon-mounted riflescope. In such instances, the offset aim point maybe displayed to a user looking through the riflescope, enabling the user to adjust his or her aim without taking his or her eye off of the target to look at a separate display. (That said, the external display unit 1755, in some embodiments, can comprise a display that is visible to a spotter or that is not otherwise visible through the riflescope.) One example of an external display unit 1755 is described in U.S. patent application Ser. No. 14/543,761, filed on Nov. 19, 2014, entitled "Compact Riflescope Display Adapter" (referred to hereafter as "the '761 application"), which is incorporated by reference herein in its entirety.

Figure 18A:
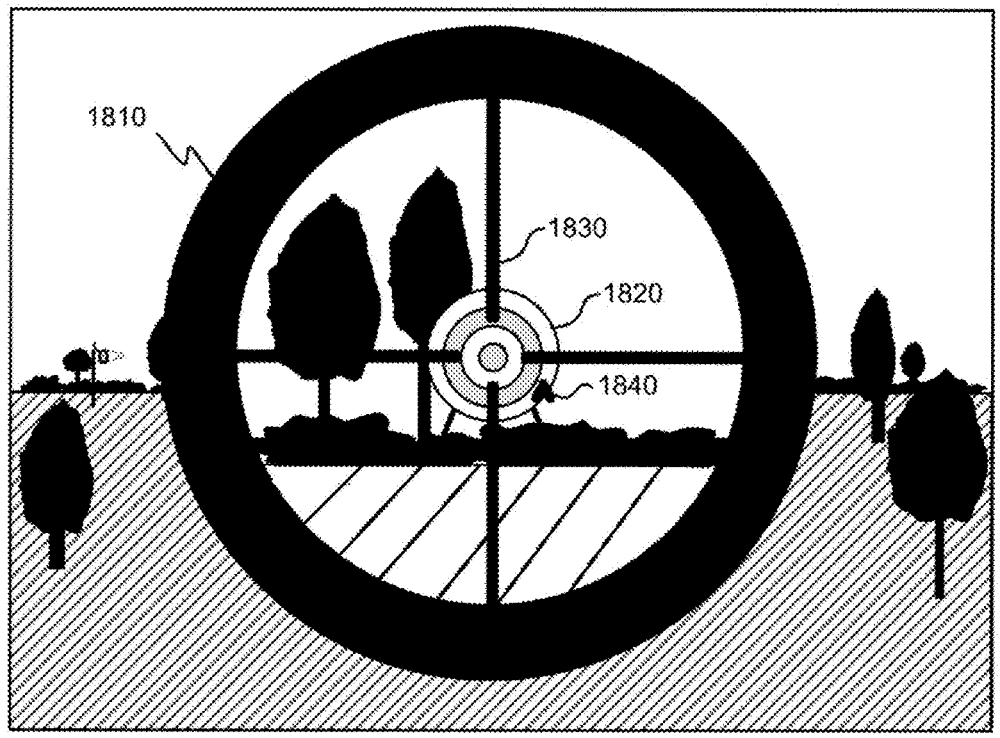
FIGS. 18A and 18B are simplified drawings illustrating a view from the perspective of a user of a riflescope.
Figure 18B:
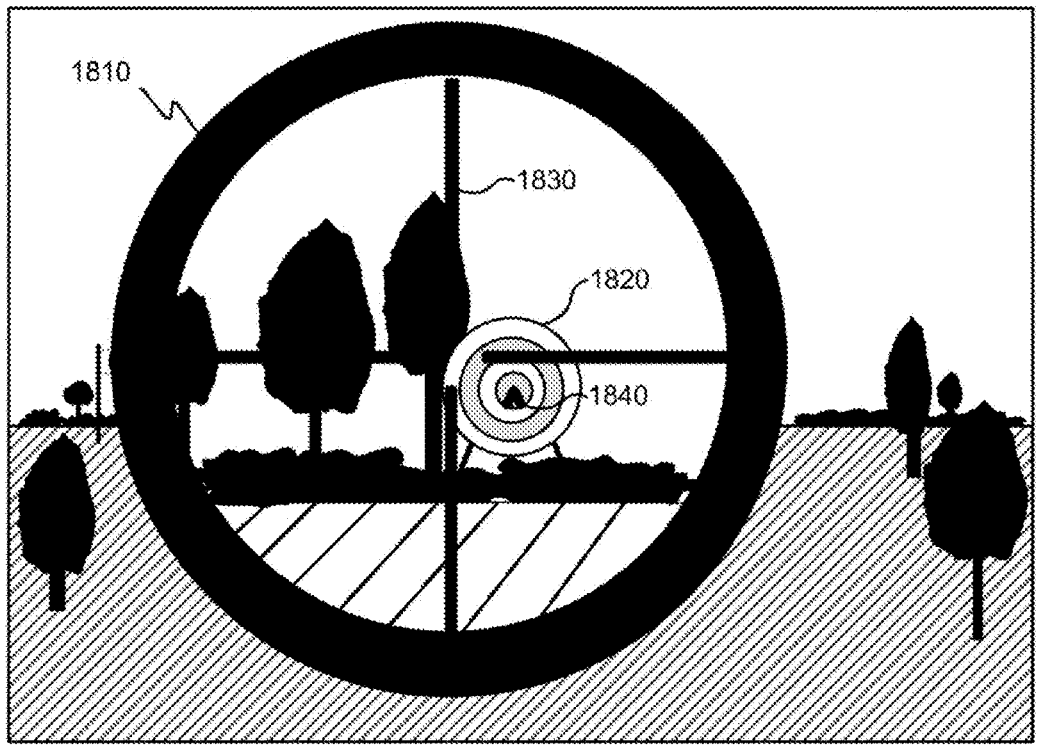

FIGS. 18A and 18B are simplified drawings provided to help illustrate how an offset aim point may be displayed by an external display unit 1755. It can be understood that, in the simplified drawings additional information provided by the display is not shown. In some embodiments, for example, information such as range, humidity, temperature, and other such information may be displayed to a user, visible through the eyepiece of the riflescope.

FIG. 18A illustrates a view from the perspective of a user of the riflescope. Here, the eyepiece 1810 provides a magnified view of a target 1820. The reticle 1830 allows the user to aim the weapon at the target 1820. According to embodiments herein, an offset aim point 1840 is provided, indicative of a ballistic solution calculated by the external ballistic computer 1760. Here, because the offset aim point 1840 is provided in the eyepiece 1810 of the riflescope via the external display unit 1755, the user does not have to view a separate display or take his or her eye off the target in order to alter the aim of the weapon in accordance with the ballistic solution. Instead, as shown in FIG. 18B, the user simply needs to move the weapon on which the riflescope is mounted such that the offset aim point 1840 is now located on the target 1820.

Figure 19:
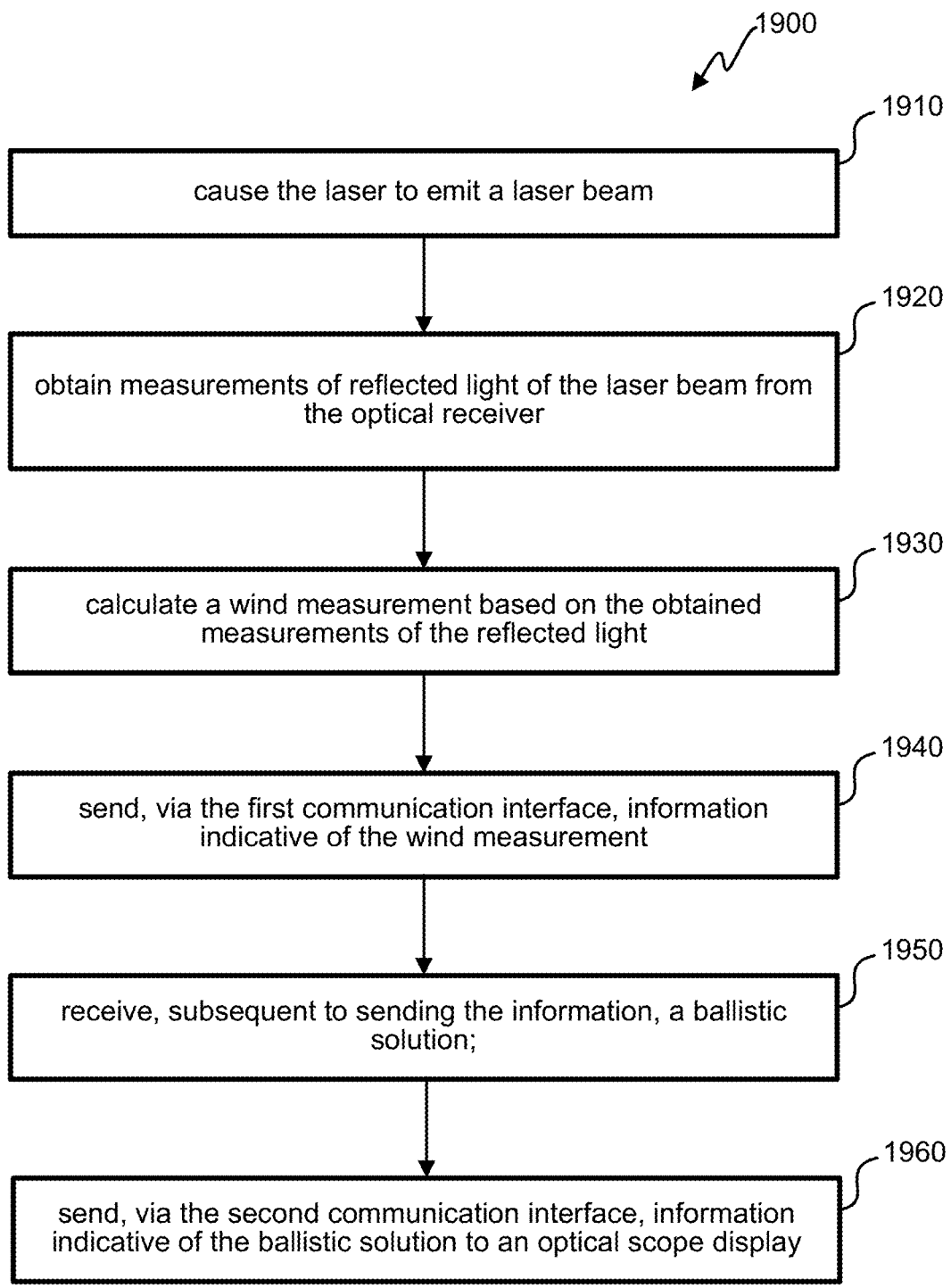
FIG. 19 is a flow diagram, illustrating a method for acquiring data, obtaining a ballistic solution, and providing a ballistic solution to an optical scope display, according to one embodiment.

FIG. 19 is a flow diagram, illustrating a method 1900 for acquiring data, obtaining a ballistic solution, and providing ballistic solution to an optical scope display, according to one embodiment. The method 1900 can be implemented, for example, by a processing unit of the low-cost laser-based optical device 1600. As with other figures herein, FIG. 19 is provided as an example. Other embodiments may vary in functionality from the functionality shown. Variations may include performing additional functions, substituting functions, performing functions in a different order or simultaneously, and the like.

The functionality at block 1910 comprises causing the laser to emit a laser beam. The architecture shown in FIG. 17, for example, may implement this functionality where the CPU 1710 causes the laser driver 1730 to operate the laser such that it emits a laser beam. In some embodiments, the functionality at block 1910 may be triggered by a user input, such as pressing a button on the low-cost laser-based optical device 1600. Alternatively, button, trigger, switch, or other input device may trigger such functionality where the input device is communicatively the coupled with the low-cost laser-based optical device 1600 and located on the weapon (e.g., at or near the trigger) for which the ballistic solution is intended to be calculated.

At block 1920, measurements of reflected light up the laser beam are obtained from the optical receiver. As explained previously, these measurements may comprise optical measurements obtained from a stereoscopic optical receiver, such as from the left optical sensor 1720, and the right optical sensor 1725, shown in FIG. 17. Based on these measurements, a crosswind between the low-cost laser-based optical device 1600 and the target on which the laser light reflected can be calculated, at block 1930.

At block 1940, information indicative of the wind measurement is sent via the first communication interface. As previously indicated, the information can be provided to an external ballistic computer. And it may be provided via wireless or wired communication, according to proprietary or standardized communication protocols, depending on desired functionality and relevant standards. In current embodiments, there are no relevant standards or protocols. Thus, proprietary communication techniques are utilized. However, industry standards in the future may develop, and such standards and protocols can be implemented in such cases.

At block 1950, a ballistic solution as received, subsequent to sending the information at block 1940. The ballistic solution can be provided by the external ballistic computer via the first communication interface, for example. Again, communication technologies, protocols, and standards may vary, depending on desired functionality.

At block 1960, information is sent to an optical scope display via the second communication interface. As noted previously, the optical scope display may be able to provide an offset aim point that is viewable through the eyepiece of the riflescope. As with the first communication interface, technologies, protocols, and/or standards may vary for the second communication interface may vary, depending on desired functionality. Communication may be wired or wireless.

Some embodiments may provide additional functionality, if desired. For example, embodiments may comprise a positioning unit, where the processing unit is configured to obtain data from the positioning unit, and send the information obtained from the positioning unit via the communication interface. Similarly, embodiments may comprise one or more orientation sensors, where the processing unit is further configured to obtain data from the one or more orientation sensors and send, via the first communication interface, information indicative of the data obtained from the one or more orientation sensors. In some embodiments, the method may comprise causing cause the laser to emit one or more laser pulses, obtaining one or more measurements of reflected light of the one or more laser pulses from one of the sensors of the optical receiver, calculating a range measurement based on the obtained measurements of the reflected light, and sending, via the first communication interface, information indicative of the range measurement. In some embodiments, emitting the laser beam may be in response to receiving a request from the first communication interface and/or user input from the user interface Embodiments of the low-cost laser-based optical device 1600 can gain an additional cost advantage over traditional embodiments of the laser-based optical device 100 by utilizing more cost effective techniques for bore sighting the laser. For example, traditional embodiments of the laser-based optical device 100 may include electrically controlled Risley prisms at the output of the laser, enabling the device to steer the laser for manual or automatic bore sighting. Embodiments of the low-cost laser-based optical device 1600, on the other hand, may utilize a manual mount capable of maintaining bore sight after receiving the shock of firing a weapon (which can be 1000 g or more). Embodiments of such a mount are provided below.

Stabilized Weapon Mount

Figure 20:
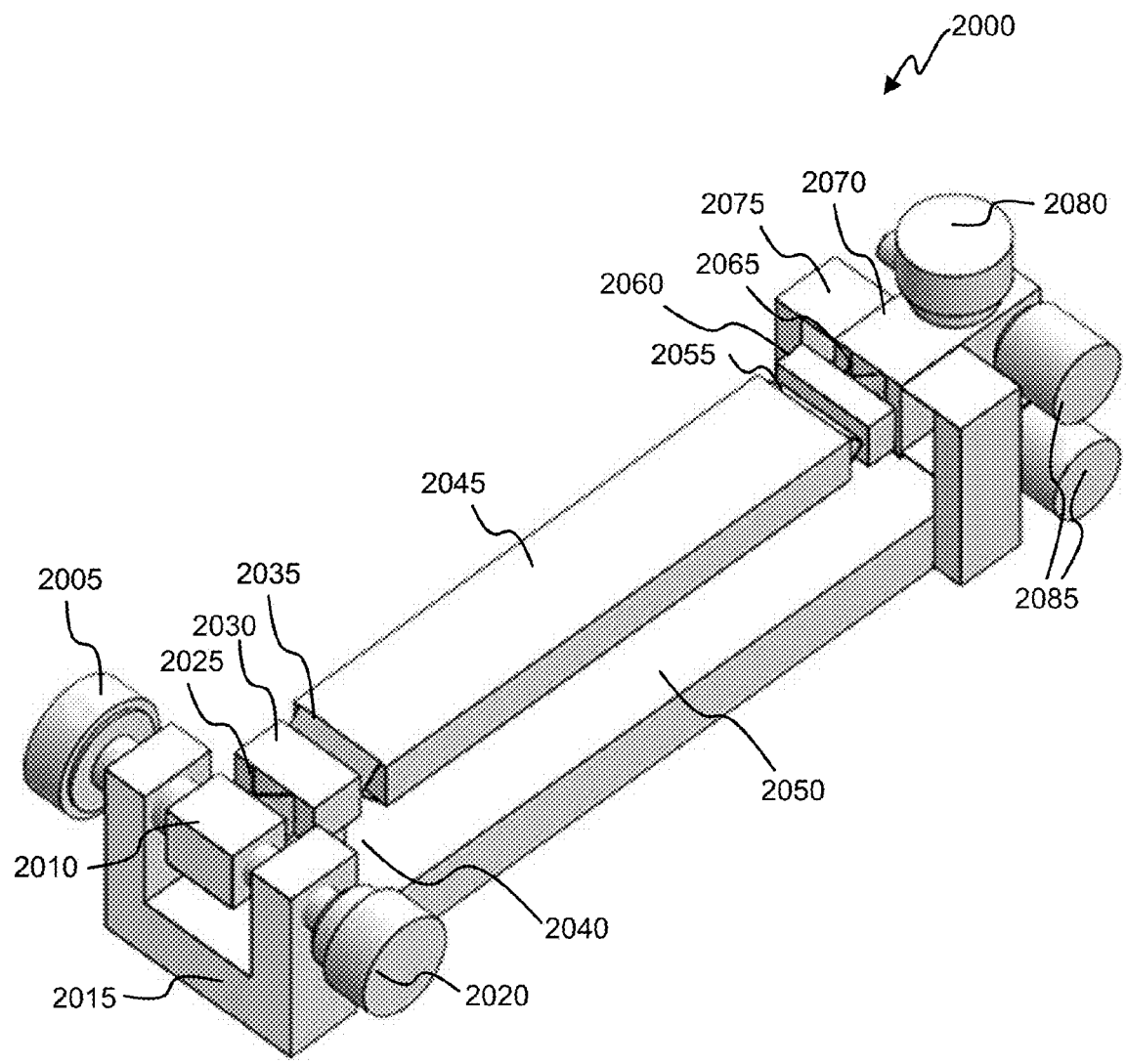
FIG. 20 is an embodiment of a stabilized weapon mount for the laser-based optical device and/or other weapon-mounted devices.

FIG. 20 is an embodiment of a stabilized weapon mount 2000 for the low-cost laser-based optical device 1600 and/or other weapon-mounted devices. Current manual mounts typically utilize friction or spring joints that fail to allow for movement of a relatively large mass structure (e.g., the optical scope or other mounted device) with precision while at the same time prohibiting any "creep" or drift the structure's initial alignment that induced shock from gun fire may cause. This is further complicated by the need for both elevation and azimuth degrees of freedom, which may undermine the rigidity of the other.

Embodiments provided herein, such as stabilized weapon mount 2000 of FIG. 20, isolate these axes from each other and provide a means to securely lock the joints to prevent movement. The payload of the mount may be a laser pointing system (such as the low-cost laser-based optical device 1600) that can be finely adjusted to less than a few hundred microradians relative to a riflescope aim point. Without isolation, adjusting either axis may induce length change to the payload mounting beam. Typical systems tolerate that change in the adjustment thread engagement play, but result in too little torque friction that causes bore sighting drift problems after gun shots. As a result, the present industry approaches fail to maintain bore sight after gun shots, particularly less than one milliradian.

Embodiments of the present invention address these and other issues by providing a mounting system with low viscous friction during azimuth/elevation adjustment, axes isolation so that the adjusters do not require large thread engagement play, isolation for the length changes of the payload beam for the cos theta changes for either elevation and azimuth, and a bi-directional locking feature so that the adjusters themselves and the payload beam are torqued from both ends to counteract the induced shock loads. Put differently, embodiments of the invention allow the mounting system to accept a payload and provide independent bore sighting adjustment capability for precision azimuth and elevation changes, while securely locking the mechanism to achieve minimal bore sighting drift after repeated gun shocks. It can be noted, however, that the embodiments of the mounting system herein can be utilized in applications other than weapon-mounted configurations.

Referring again to FIG. 20, the stabilized weapon mount 2000, according to this embodiment, can comprise the following components: an azimuth locking screw 2005, azimuth block 2010, front support arms 2015, azimuth adjustment screw 2020, front azimuth flexure 2025, vertical support block 2030, front elevation flexure 2035, vertical support flexure 2040, payload block 2045, base block 2050, rear elevation flexure 2055, pivot block 2060, rear azimuth flexure 2065, vertical adjustment block 2070, rear supporting arm 2075, elevation adjustment screw 2080, and elevation locking screws 2085. It can be understood that embodiments may vary from that which is shown. In accordance with some embodiments, for example, the payload block 2045 may be incorporated into the frame or body of an optical scope or other payload. In such instances, therefore, the stabilized weapon mount 2000 may be built into a payload.

Depending on desired functionality and manufacturing concerns, components described herein may be comprised of any of a variety of materials. According to some embodiments aluminum and/or steel may be utilized. Ultimately, the materials utilized can be chosen to be compliant enough to rely out the movement described herein without breaking. A person of ordinary skill in the art would understand how these materials may be chosen.

Operation of the stabilized weapon mount 2000 can proceed generally as follows. The azimuth adjustment screw 2020 can be adjusted to control the distance between the azimuth block 2010 and the front support arms 2015, thereby controlling the lateral rotation of the payload block 2045 by acting through the front azimuth flexure 2025, the vertical support block 2030 and the front elevation flexure 2035. To enable this functionality, the front support arms 2015 can be threaded, enabling both the azimuth adjustment screw 2020 and the azimuth locking screw 2005 to move inward and outward, relative to the front support arm 2015. In some embodiments, the front support arm 2015 that is treaded for the azimuth adjustment screw 2020 need not have the same thread as the azimuth locking screw 2005 or azimuth block 2010. Depending on desired functionality, manufacturing concerns, and/or other factors, the azimuth block 2010 may be driven by a differential screw (as shown) or a direct acting screw. In some embodiments, the front support arms 2015 may be a bolted or otherwise fastened to the base block 2050. Alternatively, the front support arms 2015 may be an integral part thereof.

The azimuth block 2010 can be threaded to pass the azimuth adjustment screw 2020. The azimuth block also mounts front azimuth flexure 2025, which (along with front elevation flexure 2035) allows lateral rotation between the azimuth block 2010 and the vertical support block 2030. It can be noted that the azimuth block 2010 does not pivot as it translates. The azimuth adjustment screw 2020 determines the lateral position of the azimuth block 2010. The vertical, axial and rotational positions of azimuth block 2010 are not determined by the azimuth adjustment screw.

Once the azimuth block 2010 is in place (via adjustment of the azimuth adjustment screw 2020), the azimuth locking screw 2005 is then used to secure the azimuth block 2010 into place. The azimuth locking screw 2005 threads through one of the front support arms 2015. In some embodiments, the azimuth locking screw 2005 can slide over azimuth adjustment screw 2020 and push against the azimuth block 2010. This secures the azimuth adjustment from drift. It also removes any residual tolerances in the azimuth adjustment.

Figure 21:
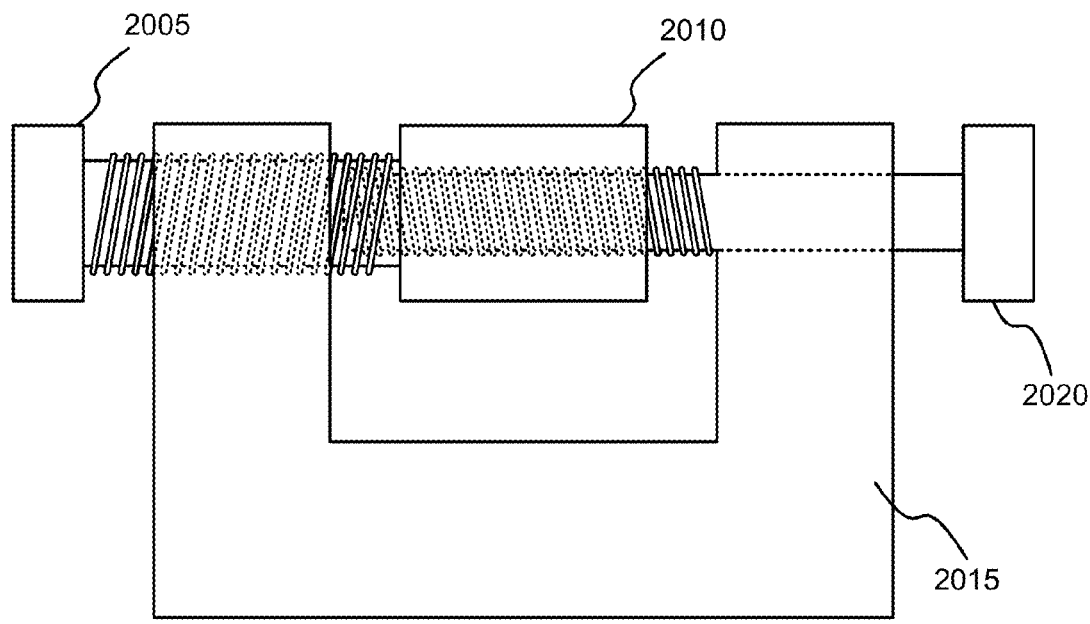
FIGS. 21 and 22 are simplified diagrams of cross-sections of the stabilized weapon mount of FIG. 20.

FIG. 21 is a simplified diagram of a cross-section of the azimuth block 2010, azimuth locking screw 2005, front support arms 2015 and azimuth adjustment screw 2020, according to one embodiment. In this embodiment, the azimuth adjustment screw 2020 is fixed relative to the front support arms, thereby causing the azimuth block 2010 to move relative to the front support arms 2015 when the azimuth adjustment screw 2020 is adjusted. Azimuth locking screw 2005 can slide over azimuth adjustment screw 2020 and push against the azimuth block 2010 to ensure minimal movement.

When the azimuth block 2010 is moved by means of the azimuth adjustment screw 2020, the front azimuth flexure 2025, together with the rear azimuth flexure 2065, enable lateral rotation of the components between them, including the vertical support block 2030, the payload block 2045 (along with the payload mounted thereon), and the pivot block 2060. Depending on desired functionality, the flexures shown herein (2025, 2035, 2055, and 2065) may be a unitary assembly or may be discrete parts. They may be bonded, welded, or otherwise fastened to their respective mounting blocks.

Similarly, when the vertical adjustment block 2070 is moved by means of the elevation adjustment screw 2080, as described below, the front elevation flexure 2035, together with the rear elevation flexure 2055, enable vertical rotation of the vertical support block 2030, the payload block 2045, and the pivot block 2060.

The vertical support block 2030 sits on the front of the front elevation flexure 2035. According to some embodiments, the vertical support block 2030 may be fixed in height above the base block 2050. The axial position of the vertical support block 2030 may be fixed by the front elevation flexure 2035. According to some embodiments, a single front elevation flexure may rest under the vertical support block 2030. An alternative configuration allows for two front elevation flexures under the azimuth block 2010.

As mentioned previously the payload block 2045 may be rotated; its elevation and azimuth angles are adjustable via adjustment screws (2020, 2080). Depending on desired functionality, the payload block 2045 may be a unitary assembly or composed of discrete parts. The parts may be bonded, welded or fastened together. The payload block 2045 is the part to which the payload may be permanently or removably mounted.

The base block 2050 can be fixed in a static position or positioned by other external means. In some embodiments, it may be mountable to a Picatinny rail. As with other components described herein, the base block 2050 may be a unitary assembly or comprised of discrete parts that may be fastened together to form a rigid structure.

As noted previously, the rear elevation flexure 2055 allows the payload block to change elevation angle. The rear elevation flexure 2055 also restrains the elevation and lateral position of the rear of the payload block and restrains the roll rotation of the payload block.

The pivot block 2060 connects the rear elevation flexure 2055 and the rear azimuth flexure 2065. The pivot block 2060 determines the position of the rear of the payload block 2045 while allowing the payload block 2045 to move in elevation and azimuth. It also controls the roll rotation of the payload block 2045. The pivot block 2060 may be a unitary assembly or composed of discrete parts fastened together to form a rigid structure.

The rear azimuth flexure 2065 allow lateral rotation between the pivot block 2060 and the vertical adjustment block 2070. The rear azimuth flexure 2065 defines the lateral position of the pivot block 2060 and the roll angle of the pivot block 2060.

The vertical adjustment block 2070 defines the vertical separation between the base block 2050 and the rear of the payload block 2045. The vertical adjustment block 2070 is threaded to pass the elevation adjustment screw 2080. The vertical adjustment block 2070 is controlled in elevation by the elevation adjustment screw 2080 and constrained in its lateral and axial position and its angle of pitch and roll by the rear elevation flexure 2055. According to embodiments, the vertical adjustment block 2070 does not pivot as it translates vertically. The elevation adjustment screw 2080 determines the vertical position of the vertical adjustment block 2070. According to some embodiments, the threaded aperture for the elevation adjustment screw can be both slotted and threaded. It also has a clearance and threaded hole for the elevation locking screw.

Figure 22:
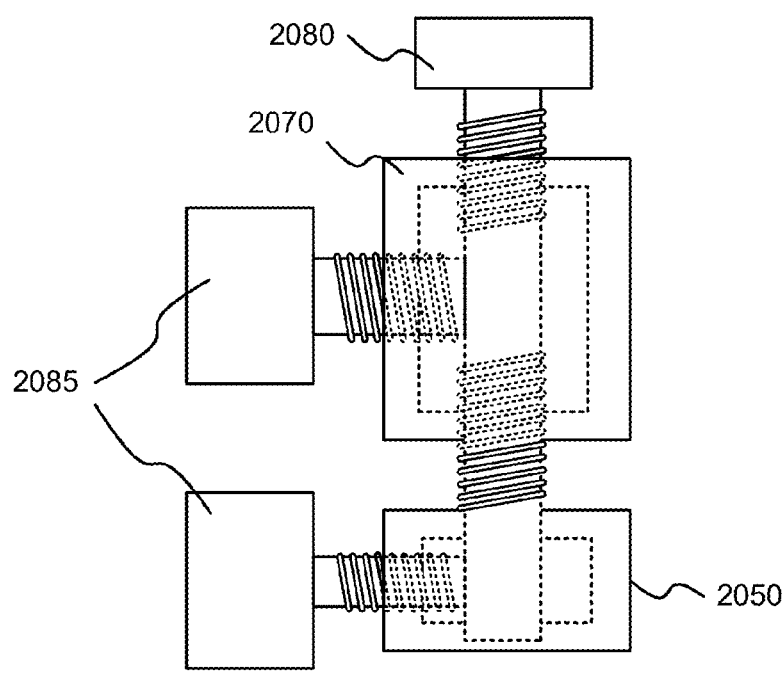

FIG. 22 is a simplified diagram of a cross-section of the elevation adjustment screw 2080, the vertical adjustment block 2070, and elevation locking screws 2085, according to one embodiment. In this embodiment, the elevation adjustment screw 2080 is fixed relative to the base block 2050, causing the vertical adjustment block 2070 to move relative to the base block 2050 when the elevation adjustment screw 2080 is adjusted. Elevation locking screws 2085 press against unthreaded portions of the elevation adjustment screw 2080 to ensure minimal movement.

The elevation adjustment screw 2080 controls the separation between the vertical adjustment block 2070 and the base block 2050. The elevation adjustment screw 2080 controls the vertical rotation of the back of the payload block by acting through the rear azimuth flexure 2065, the pivot block 2060, and the rear elevation flexure 2055. The elevation adjustment screw may be a differential screw (as shown) or a direct acting screw.

The elevation locking screws 2085 are mounted in the vertical adjustment block 2070 and the base block 2050. The elevation locking screws 2085 control the thread clearance around the elevation adjustment screw 2080. The elevation locking screws 2085 stop rotation of the elevation adjustment screw 2080 and also eliminate the axial play along the elevation adjustment screw 2080 by closing the thread clearance.

It can be noted that the embodiments described above are provided as an example only. Other embodiments may vary on this basic structure. Additionally, although the terms "front" and "back" are used, designed it used simply as a matter of convention. In practice, the stabilized weapon mount 2000 may be rotated 180°. That is, embodiments may utilize such that there is no "front" or "back." Additionally, alternative embodiments may utilize different thread configurations for the screws, position one or more screws at a different location, or provide other such variations, depending on desired functionality.

Optical Sensor for Range Finding and Wind Sensing Measurements

Returning again to FIG. 17, embodiments of the low-cost laser-based optical device 1600, may include left and right optical sensors 1720 and 1725, respectively. And as previously indicated, such sensors can comprise a photodiode. It can be noted, however, that additional circuitry may be needed in order to provide adequate measurements for both range finding and wind sensing. Moreover, it may be undesirable to attempt to incorporate such circuitry into the CPU 1710 or rangefinder codec 1715 due to the additional capacitance that routing lines would create, which can be detrimental to functionality of the optical sensors 1720, 1725.

Below, techniques are disclosed for providing an optical sensor that can be used for wind sensing in an optical scope. The optical sensor can include a photodiode, an electrical switch, a trans-impedance amplifier (TIA), and a capacitive trans-impedance amplifier (CTIA), enabling the optical sensor to perform both wind-sensing and range-finding functions. Some embodiments may include some or all of these components in an application-specific integrated circuit (ASIC), depending on desired functionality. In keeping the TIA, CTIA, and other circuitry close to the photodiode, this reduces the capacitance of routing lines connecting the circuitry to the photodiode, thereby reducing the impact of such routing lines in the functioning of the sensor.

Figure 23:
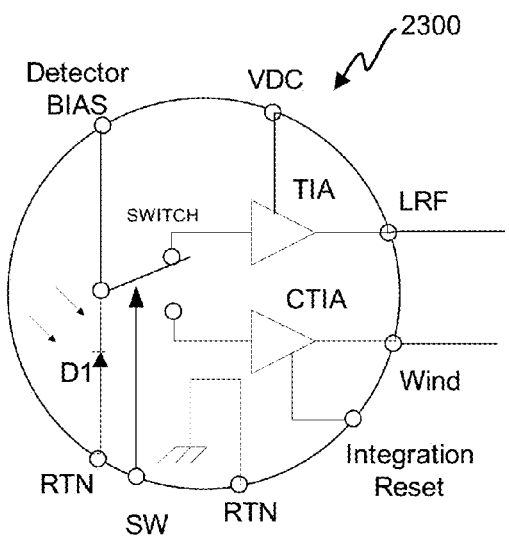
FIG. 23 is a circuit diagram of an integrated sensor, according to one embodiment.

FIG. 23 is a circuit diagram of an integrated sensor 2300, according to one embodiment. As shown, inputs of the integrated sensor 2300 comprise a detector bias, VDC, return (RTN) (e.g., ground), switch (SW), and an integration reset input. Outputs include signals for laser range finding (LRF) and wind sensing ("Wind"). As can be seen, the integrated sensor 2300 includes a switch that is activated with the SW input. The switch enables the integrated sensor 2300 to toggle between circuitry, enabling the integrated sensor 2300 to perform laser range finding functions or wind sensing functions, depending on which function is needed.

The switch is coupled to the output of diode D1, connecting D1 with either the trans-impedance amplifier (TIA) or a capacitive trans-impedance amplifier (CTIA), as needed.

The TIA is utilized when taking laser range finding measurements. When operating in a laser range finding mode, the integrated sensor 2300 operates with the switch connecting the output of diode D1 to the input of the TIA. The TIA operates as a low pass filter that integrates an incoming signal but decays over time. According to some embodiments, the TIA is capable of receiving a plurality of pulses from diode D1, as a result of pulsed laser light being transmitted by a laser transmitter and reflected off of the target. The bandwidth of the TIA may vary depending on desired functionality. According to some embodiments, this bandwidth can be approximately 50 MHz. The optical pulse is received at D1 can vary in width, depending on desired functionality. According to some embodiments, for example, optical pulse is can be between 10 and 22 ns, and each pulse will be integrated by the TIA.

The TIA can enable the integrated sensor 2300 to provide standard range-finding functionality. According to some embodiments, for example, approximately 100,000 pulses of laser light may be received over a period of 100 ms. These pulses can be added up into a "range gate" to reduce the effect of noise (where the signal increases linearly, but the noise sums as a square root). The LRF signal of the integrated sensor 2300 can be provided to an analog to digital converter (ADC) for range finding calculations.

The CTIA is utilized when taking wind sensing measurements. When operating in a wind sensing mode, the integrated sensor 2300 operates with the switch connecting the output of diode D1 to the input of the CTIA. In contrast to the TIA, the CTIA does not decay over time, although it can be reset with the integration reset input signal.

During wind sensing measurements, the laser transmitter emits a continuous wave (CW) laser beam, according to some embodiments. Here, the laser light may be only slightly above background noise. (To help enable wind sensing measurements, powerful fiber laser can be used with low beam divergence. Sun filters and/or other optics can be used to help reduce the background noise and corresponding noise current at the CTIA.) During operation, the output of the diode D1, resulting from noise and received laser light, is provided to the CTIA, which integrates this signal over time. Depending on desired functionality, the refresh rate of the output can vary. According to some embodiments, the CTIA integrates over a period of 1 ms. The output of the CTIA is then read, and the CTIA is reset via the integration reset input of the integrated sensor 2300. This process is conducted over and over to obtain different readouts and determine scintillations in the received a laser light. The output can then be provided to a processor or other circuitry to analyze the outputs and determine a crosswind measurement as discussed previously.

According to some embodiments, noise may be reduced using additional or alternative techniques. For example, the CTIA may integrate over a period of time during which the laser transmitter is not transmitting a laser beam. This can be done in order to determine a baseline noise level. Then the CTIA can integrate over an equal period of time with the laser light. The two signals—with and without the laser light—can then be subtracted, thereby canceling out noise common between the two signals.

The type of diode D1 can vary, depending on desired functionality. According to some embodiments, for example, the diode can comprise a PIN diode. In some embodiments, this may be an InGaS mesa PIN diode. In some embodiments, the diode may comprise a flip-chip diode.

According to some embodiments, the circuitry in FIG. 23 accompanying the diode can be disposed in an ASIC. Additionally, the diode and the circuitry may be disposed in a single package, as shown in FIGS. 24A and 24B.

Figure 24A:
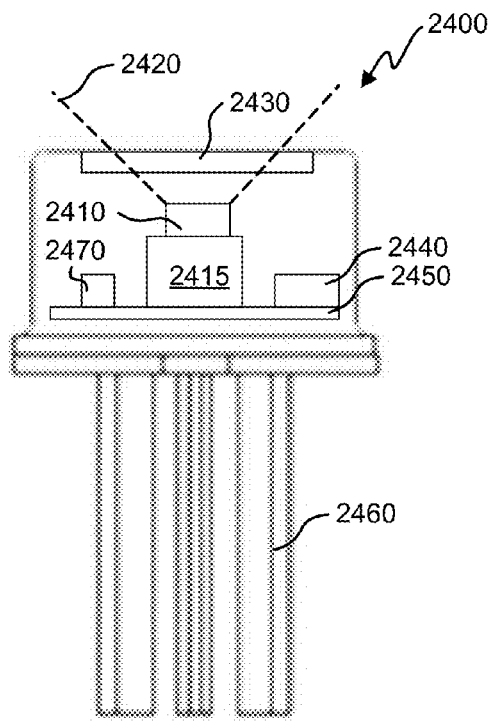
FIGS. 24A and 24B are, respectively, simplified cross-sectional and perspective illustrations of an example package into which the integrated sensor of FIG. 23 may be incorporated.
Figure 24B:
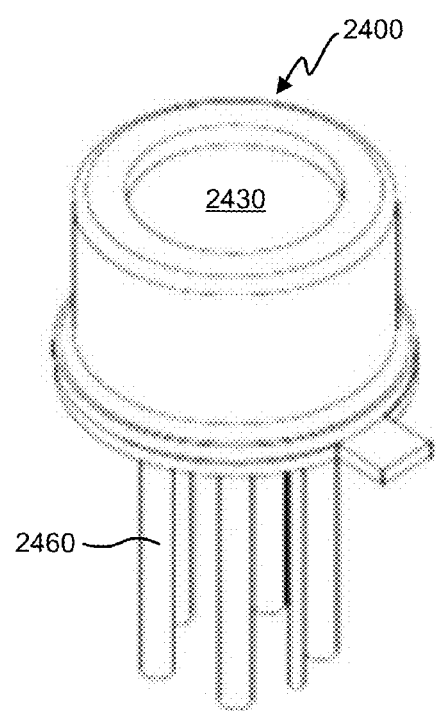

FIGS. 24A and 24B are, respectively, simplified cross-sectional and perspective illustrations of an example package 2400 into which the integrated sensor 2300 may be incorporated. Here, the photodetector 2410 (e.g., diode D1 of FIG. 23) is situated near a window 2430, providing the photodetector 2410 with a field of view 2420 sufficient to provide for the functionality described herein above. According to some embodiments, the photodetector 2410 may be disposed on a pedestal 2415 mounted on the circuit card 2450 to help ensure the proper spacing of the photodetector 2410 from the window 2430. ASIC 2440 can be disposed nearby on the circuit card 2450. As noted above, the utilization of an ASIC 2440 (rather than discrete components), along with its proximity to the photodetector 2410 can help keep lead length low, reducing possible degradation due to stray capacitance caused by the leads. The package 2400 can be hermetically sealed, according to embodiments, and pins 2460 can be utilized to incorporate the package 2400 onto a larger circuit board, connecting the components within the package 2400 with other components of a low-cost laser-based optical device 1600, for example. The package 2400 may further include other circuitry 2470 (e.g., in addition to the ASIC 2440) for noise canceling and/or filtering.

Figure 25:
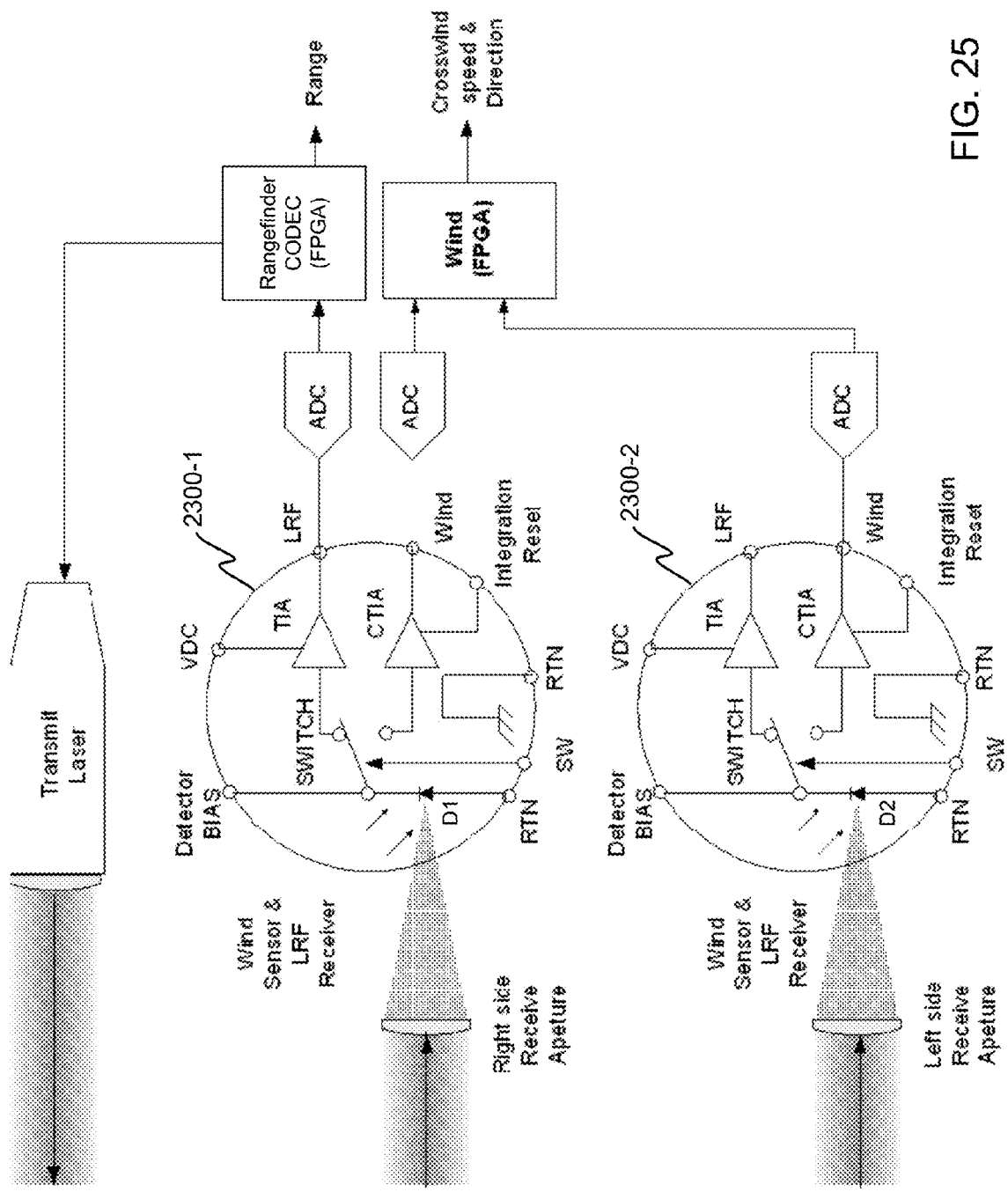
FIG. 25 is a circuit diagram illustrating how sensors can be utilized for laser range finding and wind sensing in a larger device, in one embodiment.

FIG. 25 is a circuit diagram illustrating how integrated sensors 2300-1 and 2300-2 can be utilized for laser range finding and wind sensing in a larger device (e.g., the low-cost laser-based optical device 1600 of FIG. 17), in one embodiment. Here, the right sensor 2300-1 is utilized for both wind sensing and range finding measurements. The left sensor 2300-2 is utilized only for wind sensing. As can be seen, the LRF output of the integrated sensor 2300-2 is not connected with a processing unit. As with other figures herein, embodiments are not limited to the configuration shown in FIG. 25. Additionally, it will be understood that various components are omitted for clarity. For example, the SW input of one or both of the integrated sensors 2300 may be provided by a processing unit that is not shown. Moreover, the output measurements labeled "Range" and "Crosswind speed & Direction" can be provided to a processing unit that is not shown. Components labeled as FPGAs may be replaced with other types of processing units, ASICs, or other IP equaling circuitry.

It can be noted that one or more components shown in FIG. 25 may correlate with components of the low-cost laser-based optical device 1600, as shown in FIG. 17. For example, integrated sensors 2300-1 and 2300-2 can correlate with right optical sensor 1725 and left optical sensor 1720, respectively. The Rangefinder CODEC (FPGA) of FIG. 25 can correlate with the rangefinder codec 1715 of FIG. 17. A person of ordinary skill in the art will recognize additional correlations.

The functionality of the components shown in FIG. 25 can be generally described as follows. The transmit laser may generate pulses for laser range finding as a result of input from the Rangefinder CODEC (FPGA). Reflected laser light can then enter the right side receive aperture and the left side receive aperture, detected by the photodetectors of the right integrated sensor 2300-1 and the left integrated sensor 2300-2, respectively. During the range finding mode, the switch can connect the photodetectors of each integrated sensor to the corresponding TIA circuitry. Because the TIA circuitry of the left integrated sensor 2300-2 is not connected with an output, signals output by the TIA are ignored. However, the output of the TIA circuitry of the right integrated sensor 2300-1 is provided to an ADC, which converts the output of the TIA to a digital signal and provides it to the Rangefinder CODEC (FPGA). The Rangefinder CODEC (FPGA) then calculates the range based on the input from the ADC and provides the range measurement as an output.

When operating in a wind sensing mode, the transmit laser can generate a laser beam that illuminates a target. Reflected laser light enters the right side received aperture and the left side receive aperture, illuminating the photodetectors in the right integrated sensor 2300-1 and the left integrated sensor 2300-2, respectively. In the wind sensing mode, the switch connects the output of the photodetectors of each integrated sensor 2300 to corresponding CTIA circuitry. The outputs of the CTIA circuitry of both integrated sensors 2300 are provided to respective ADC circuits, which convert the analog input from the CTIA circuitry to a digital signal. This is then provided to the Wind (FPGA). The Wind (FPGA) uses these input digital signals to calculate crosswind speed and direction, which it then provides as an output.

As previously noted, the integrated sensors 2300 can be incorporated it into devices such as the low-cost laser-based optical device 1600 of FIG. 17. However, other devices may also take advantage of such sensors. This can include a more fully-integrated device, as described below.

Riflescope with Integrated Wind Sensor and Targeting Display

Embodiments of optical devices described previously provide for wind sensing and range-finding measurements, and may communicate with additional devices such as a riflescope and the riflescope display, among other things. However, additional devices are contemplated. One such device is illustrated in FIG. 26.

Figure 26:
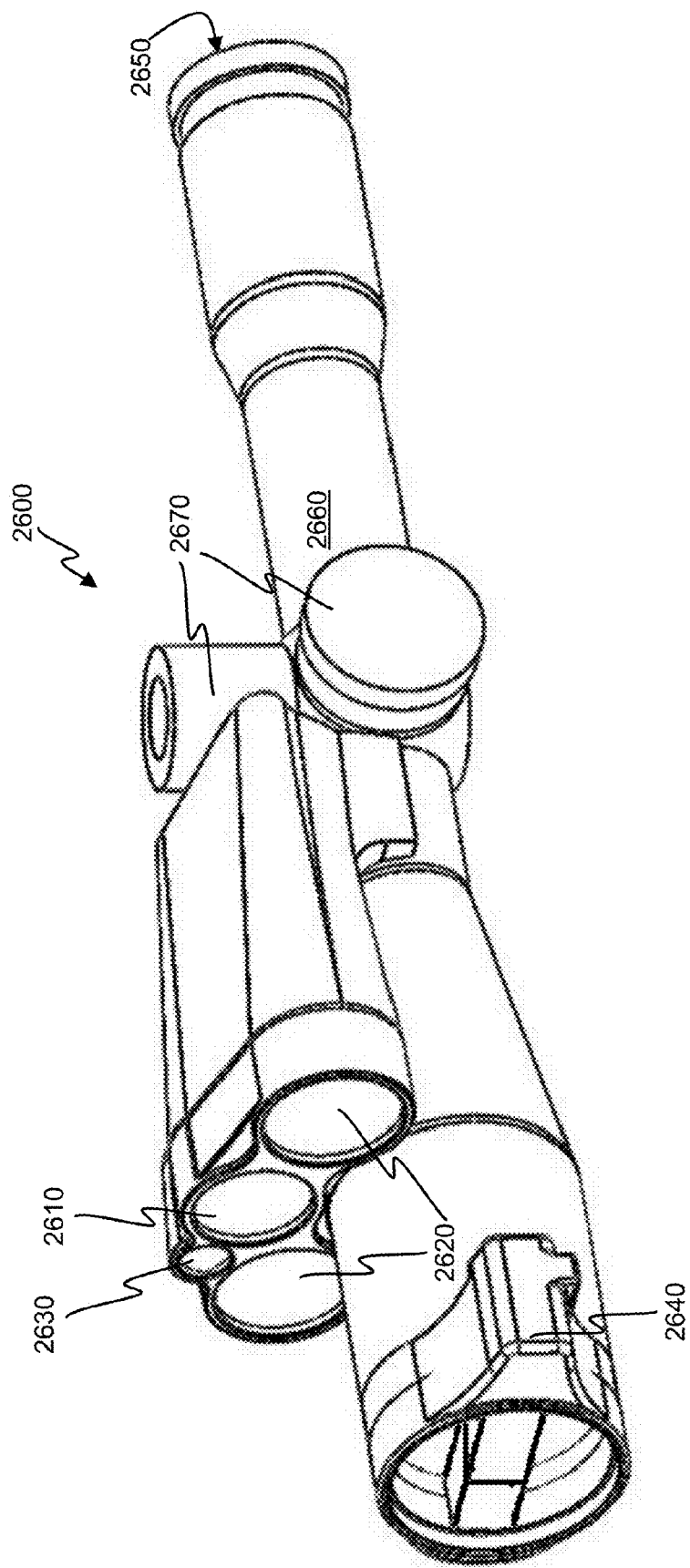
FIG. 26 is a perspective view of an integrated riflescope, according to an embodiment.

FIG. 26 is a perspective view of an integrated riflescope 2600, according to some embodiments. The integrated riflescope 2600 comprises a weapon-mounted optical scope that determines crosswind measurements and displays a ballistic solution without the need for a separate device. As such, the integrated riflescope 2600 can provide an all-in-one solution for weapon-mounted sniper and other applications.

As with other embodiments herein, the integrated riflescope 2600 can comprise laser transmitter optics 2610 and stereoscopic laser receiver optics 2620, capable of transmitting and receiving a laser beam and calculating wind measurements therefrom. According to the embodiment illustrated, a second laser transmitter optics 2630 may be included. The second laser transmitter optics 2630 can comprise a laser distinct from the laser of the laser transmitter optics 2610 for range-finding. Thus, according to the embodiment illustrated, a first laser may utilize laser transmitter optics 2610 to emit a laser beam for wind sensing measurements. The second laser transmitter optics 2630 may be utilized by a second laser to transmit laser pulses for range-finding measurements. It can be noted, however, that other embodiments may incorporate these two laser transmitter optics, using a single laser transmitter for both wind sensing and range-finding applications.

Embodiments of the integrated riflescope 2600 may further include a display 2640 at the input aperture (rather than internally at the first-focal-plane, enabling for simpler, more cost-effective embodiments). Details regarding a display 2640 capable of being incorporated into a device at the input aperture are provided in the '761 application, which was previously incorporated herein above. Because the display 2640 is incorporated into the integrated riflescope 2600, it may share common housing components and/or may include internal wiring connecting the electronic components of the integrated riflescope (including components used for range-finding and/or wind sensing) with the display 2640.

The integrated riflescope 2600 can be advantageous in several respects. The placement of the laser transmitter optics 2610, 2630 in the stereoscopic laser receiver optics 2620 above the body of the riflescope 2660 can help ensure that range-finding and wind sensing functions are not hindered by additional elements in front of the integrated riflescope 2600, such as an IR camera. Because the display 2640 and wind sensing and range-finding components can be securely fastened together in a single housing, problems with regard to misalignment between the components are minimized.

Other features of the integrated riflescope 2600 include, and eyepiece 2650 and turret adjustments 2670. The turret adjustments 2670 can provide pan, tilt, and rotation for alignment of the integrated riflescope 2600 with the weapon on which it is mounted. A user may view the target via the eyepiece 2650, which may provide a magnified view of the target, as well as possible information displayed by the display 2640. Such information can include, for example, offset aim point (as determined by a ballistic computer from, for example, range and/or wind measurements obtained from these functions of the integrated riflescope 2600), range, wind measurement, temperature, humidity, bearing, and other such information gathered from sensors within the device and/or information provided to the device by, for example, a separate device.

Electrical components of the integrated riflescope 2600 can be similar to the components of the low-cost laser-based optical device 1600 of FIG. 17, as described previously. The integrated riflescope 2600 may further include additional sensors, such as humidity, temperature, and/or the like, which it may use for computing a ballistic solution. Additionally, embodiments may provide for an external ballistic computer to be utilized in the manner described above with regard to the low-cost laser-based optical device 1600. Alternatively, the integrated riflescope 2600 may compute a ballistic solution internally using a processing unit (such as the CPU 1710 of FIG. 17).

As with the low-cost laser-based optical device 1600, the integrated riflescope 2600 may comprise one or more communication interfaces. These interfaces may communicate with other devices using wireless or wired technology, as described above with regard to the low-cost laser-based optical device 1600.

Figure 27:
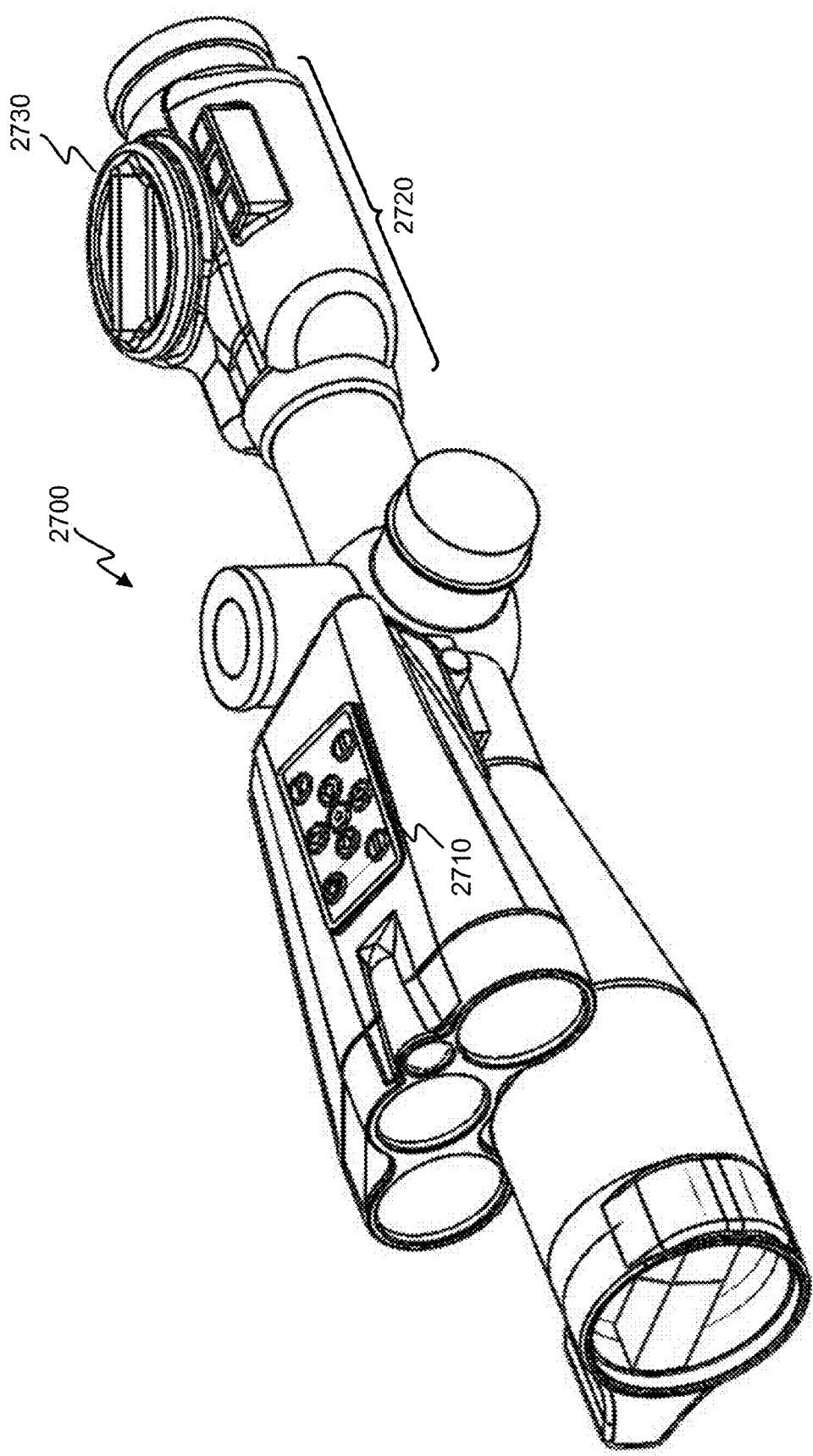
FIG. 27 is a perspective view of an integrated riflescope, according to another embodiment.

FIG. 27 is a perspective view of an integrated riflescope 2700, according to another embodiment. As can be seen, the integrated riflescope 2700 of FIG. 27 is similar in many respects to the integrated riflescope 2600 of FIG. 26, such as providing a display at the input aperture, providing a laser transmitter and stereoscopic receiving optics for wind sensing applications, and providing separate transmitter optics for range finding applications. The integrated riflescope 2700 further includes turret adjustments that can adjust the alignment of the integrated riflescope 2700 in the manner described previously with regard to the integrated riflescope 2600. The integrated riflescope 2700 of FIG. 27, however, includes additional features, as illustrated.

One such additional feature is a keypad 2710. According to some embodiments, the keypad 2710 can be used for initial alignment and configuration. That is, it can be utilized as an input to one or more of the electrical components disposed within the integrated riflescope 2700. The type, configuration, and amount of buttons or other input elements of the keypad 2710 may vary, depending on desired functionality.

Another additional feature is an enhanced image assembly 2720. As shown, according to some embodiments, the enhanced image assembly 2720 can be disposed in the integrated riflescope 2700 near the eyepiece. The enhanced image assembly 2720 can provide a user looking through the eyepiece of the integrated riflescope 2700 with an enhanced image of the target at which the integrated riflescope 2700 is aimed. The enhanced image assembly 2720 can do this by capturing a portion of the light entering the aperture of the integrated riflescope 2700, performing image processing on the captured light to create an enhanced image, and providing the enhanced image on a display viewable through the eyepiece of the integrated riflescope 2700. The enhanced image assembly 2720 may include a dial 2730 (or other mechanism) that enables a user to switch between direct view and enhanced view modes.

For example, the dial 2730 may cause a mirror to toggle between direct view and enhanced view modes. In the direct view mode, the mirror is out of the pathway of light entering the aperture in passing through the integrated riflescope 2700 to the eyepiece. In the enhanced view mode, the mirror is configured to direct light from a display such that it is visible through the eyepiece. This functionality is illustrated in FIGS. 28A and 28B.

Figure 28A:
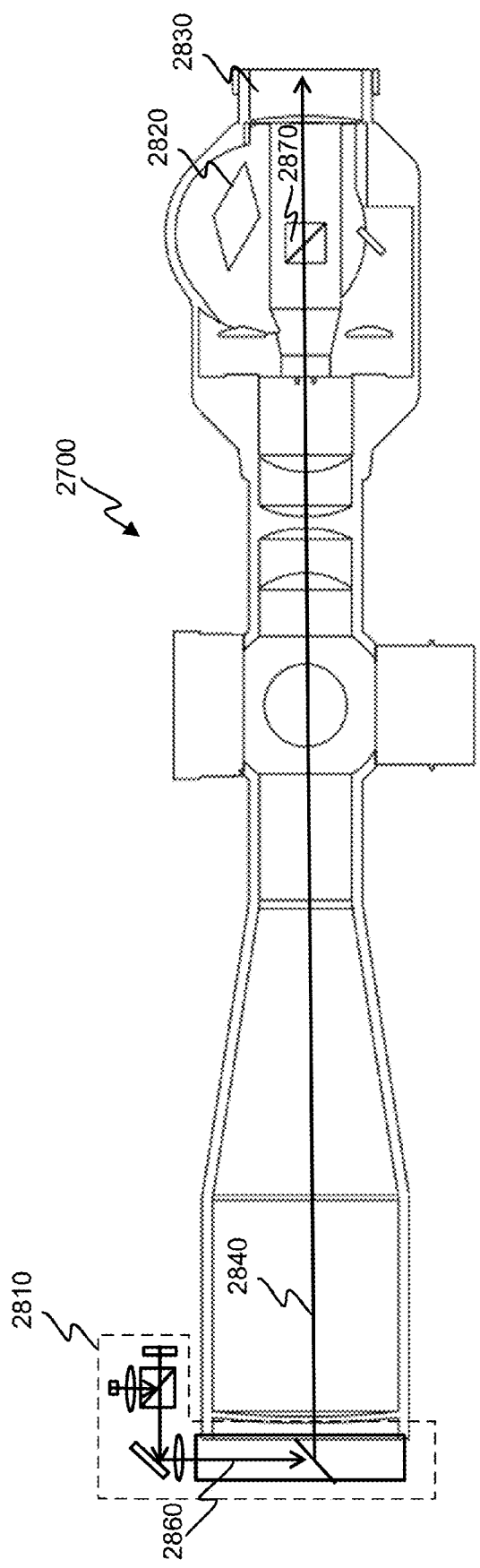
FIGS. 28A and 28B are simplified cross-sectional views of the integrated riflescope of FIG. 27, according to an embodiment.

FIG. 28A is a simplified cross-sectional view of the integrated riflescope 2700 of FIG. 27, according to one embodiment. It can be noted however, that additional optical elements may be present in alternative embodiments to provide for magnification and/or other functionality.

Here, the integrated riflescope 2700 is operating in a direct view mode. In this mode, light 2840 entering that aperture passes through the optics of the integrated riflescope to the eyepiece 2830, allowing a user looking into the eyepiece 2830 to view a target at which the integrated riflescope 2700 is aimed. The dial 2730 (not shown here) is adjusted such that a mirror 2820 is not in the optical path of the light 2840. A beam splitter 2870 may be tuned to deflect only near IR and/or IR light, thereby allowing visible light to pass through to the eyepiece. In the direct view mode, display optics 2810 may cause additional light 2860 to enter through the aperture for display to a user. As indicated previously, the display may provide an offset aim point, temperature, humidity, and/or other readings or measurements, depending on desired functionality. This information is viewable to a user through the eyepiece 2830, and overlaid on the incoming image.

Figure 28B:
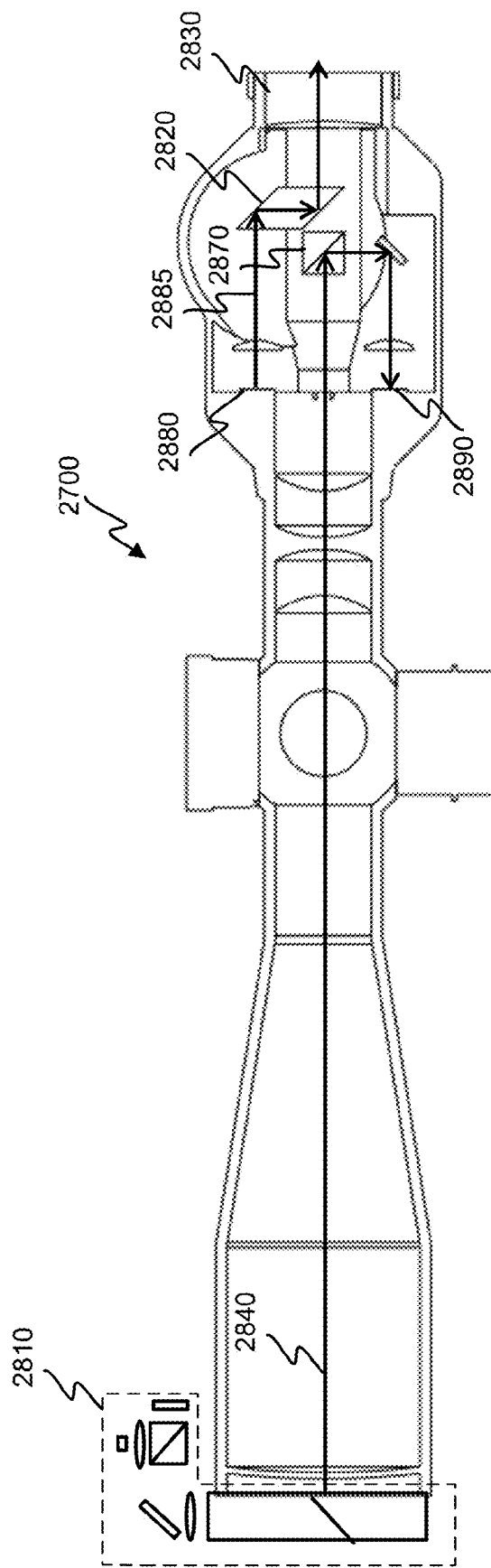

FIG. 28B is a simplified cross-sectional view of the integrated riflescope 2700 operating in an enhanced view mode. Here, the dial 2730 is adjusted such that the mirror 2820 obstructs the visible light passing through the integrated riflescope and directs light coming from the enhanced image display 2880 the eyepiece 2830. The beam splitter 2870 redirects a portion of the light (such as near IR and/or IR light) to CMOS camera 2890. (Other optical elements such as mirrors or lenses may be utilized, as shown.) The image captured at the CMOS camera 2890 is then processed to undergo various image enhancements, and the output images are displayed on an enhanced image display 2880. As shown, various optics including the mirror 2820 to direct light from the enhanced image display 2880 to the eyepiece 2830 such that the image on the enhanced image display 2880 is viewable to a user looking into the eyepiece 2830.

The enhanced image display 2880 can utilize any of a variety of technologies, depending on desired functionality. For example, the enhanced image display 2880 may be a liquid crystal display (LCD), a light emitting diode (LED) display, an organic LED (OLED) display, and the like. Aspects of the display such as brightness, contrast, and the like may be adjustable by a user, according to some embodiments.

The processing of the images can vary, depending on desired functionality. Frequently, the turbulence that enables wind sensing measurements to be taken between a target and the integrated riflescope 2700, can cause blur in an image of the target. In some embodiments, therefore, the image captured by the CMOS camera 2890 can be provided to a processing unit for image processing. Such image processing can include image sharpening and/or other techniques for reducing blur or providing other enhancements. Depending on the processing power of the processing unit, the enhanced images can be output on the enhanced image display 2880 at a speed of approximately 10 to 15 fps. According to some embodiments, the processing unit may comprise a CPU (e.g., the CPU 1710 of FIG. 17). In other embodiments, the processing unit may comprise a specialized processing unit, such as a digital image processor, digital signal processor, and/or the like.

As illustrated, the display optics 2810 may not provide input at the aperture of the integrated riflescope 2700 when the integrated riflescope 2700 is operating in an enhanced view mode. This is because information that would normally be overlaid on the incoming image by the display optics 2810 can instead be provided in the image shown on the enhanced image display 2880. (E.g., the processing unit generating the enhanced image can cause text and/or other object to be shown in the enhanced image.) That said, embodiments may provide for the utilization of the display optics 2810 during an enhanced view mode, pending on desired functionality.

Various components may be described herein as being "configured" to perform various operations. Those skilled in the art will recognize that, depending on implementation, such configuration can be accomplished through design, setup, placement, interconnection, and/or programming of the particular components and that, again depending on implementation, a configured component might or might not be reconfigurable for a different operation.

Computer programs incorporating various features of the present invention may be encoded on various computer readable storage media; suitable media include magnetic media, optical media, flash memory, and the like. Non-transitory computer-readable storage media encoded with the program code may be packaged with a compatible device or provided separately from other devices. In addition program code may be encoded and transmitted via wired optical, and/or wireless networks conforming to a variety of protocols, including the Internet, thereby allowing distribution, e.g., via Internet download.

While the principles of the disclosure have been described above in connection with specific embodiments, it is to be clearly understood that this description is made only by way of example and not as limitation on the scope of the disclosure. Additional implementations and embodiments are contemplated. For example, the techniques described herein can be applied to various forms of optical devices, which may comprise a smaller portion of a larger optical system. Yet further implementations can fall under the spirit and scope of this disclosure.

What is claimed is:

1. A weapon-mounted optical scope comprising:
    an objective lens;
    a display assembly configured to, when displaying an object, emit light such that the emitted light enters the objective lens;
    an eyepiece configured to enable a user to see an image from light entering the objective lens;
    one or more orientation sensors;
    a positioning unit;
    a first laser;
    an optical receiver comprising: a first subassembly, disposed a first horizontal distance from the first laser and disposed a first vertical distance from the first laser, comprising a first sensor and a set of one or more first lenses configured to direct a reflected laser beam toward the first sensor; and a second subassembly, disposed a second horizontal distance from the first laser and disposed a second vertical distance from the first laser, comprising a second sensor and a set of one or more second lenses configured to direct the reflected laser beam toward the second sensor; and
    a processing unit communicatively coupled with the first laser, the optical receiver, the one or more orientation sensors, and the positioning unit, wherein the processing unit is configured to:
        cause the first laser to emit a laser beam in the direction of the image;
        obtain measurements from the optical receiver by: receiving a first measurement, from the first sensor, of the laser beam reflected from the image into the one or more first lenses; receiving a second measurement, from the second sensor, of the laser beam reflected from the image into the one or more second lenses;
        calculate a wind measurement based on the obtained measurements received by the optical receiver by: converting the first measurement into a first digital signal; converting the second measurement into a second digital signal; and manipulating the differences between the first digital signal and the second digital signal and the first horizontal distance, the first vertical distance, the second horizontal distance, and the second vertical distance;
        determine a ballistic solution based on the wind measurement and data from the one or more orientation sensors and the positioning unit; and
        cause the display assembly to display information indicative of the ballistic solution.

2. The weapon-mounted optical scope of claim 1, further comprising a second laser, wherein the processing unit is further configured to:
    cause the second laser to emit one or more laser pulses;
    obtain one or more measurements of reflected light of the one or more laser pulses from the sensor of one subassembly of the optical receiver;
    calculate a range measurement based on the obtained one or more measurements of the reflected light; and
    determine the ballistic solution further based on the range measurement.

3. The weapon-mounted optical scope of claim 1, further comprising an enhanced image assembly, the enhanced image assembly including:
    a beam splitter configured to direct a portion of the light entering the objective lens to a camera communicatively coupled with the processing unit, wherein the processing unit is configured to process an image captured by the camera;
    an internal display configured to show the image processed by the processing unit; and
    a mirror configured to direct light from the internal display such that the internal display is viewable through the eyepiece.

4. The weapon-mounted optical scope of claim 3, wherein the enhanced image assembly further comprises a dial to control orientation of the mirror such that the mirror operates in two modes:
    a first mode in which the mirror is configured to direct light from the internal display such that the internal display is viewable through the eyepiece, and
    a second mode in which the mirror is configured to enable the user to see the image from the light entering the objective lens.

5. The weapon-mounted optical scope of claim 3, wherein the beam splitter is configured to direct infrared light to the camera.

6. The weapon-mounted optical scope of claim 3, wherein the processing unit is configured to process the image captured by the camera by reducing blur in the image.

7. The weapon-mounted optical scope of claim 1, wherein the sensor of each subassembly comprises a photodiode.

8. The weapon-mounted optical scope of claim 1, wherein the sensor of each subassembly comprises a portion of a camera.

9. The weapon-mounted optical scope of claim 8, wherein the camera is a shortwave infrared (SWIR) camera.

10. The weapon-mounted optical scope of claim 1, further comprising a keypad configured to operate as a user input interface to one or more electrical components disposed within the weapon-mounted optical scope.

* * * * *

UNITED STATES PATENT AND TRADEMARK OFFICE
CERTIFICATE OF CORRECTION

| | |
|---|---|
| PATENT NO. | : 9,816,782 B2 |
| APPLICATION NO. | : 15/065701 |
| DATED | : November 14, 2017 |
| INVENTOR(S) | : Tony Maryfield et al. |

Page 1 of 1

It is certified that error appears in the above-identified patent and that said Letters Patent is hereby corrected as shown below:

In the Specification

Column 1, Insert in front of Line 53 --This invention was made with government support under Contract HR0011-12-C-0088/HR0011-09-C-0016, awarded by the Defense Advanced Research Projects Agency (DARPA). The government has certain rights in the invention.--

Signed and Sealed this
Sixteenth Day of July, 2019

Andrei Iancu
*Director of the United States Patent and Trademark Office*